US011531055B2

(12) United States Patent
Chong

(10) Patent No.: US 11,531,055 B2
(45) Date of Patent: Dec. 20, 2022

(54) FACILITATING DEBUGGING ELECTRONIC DEVICE, SYSTEM AND METHOD THEREOF

(71) Applicant: Tit Tsang Chong, Hong Kong (CN)

(72) Inventor: Tit Tsang Chong, Hong Kong (CN)

(*) Notice: Subject to any disclaimer, the term of this patent is extended or adjusted under 35 U.S.C. 154(b) by 372 days.

(21) Appl. No.: 16/612,607

(22) PCT Filed: Aug. 21, 2017

(86) PCT No.: PCT/CN2017/098336
§ 371 (c)(1),
(2) Date: Nov. 11, 2019

(87) PCT Pub. No.: WO2019/036857
PCT Pub. Date: Feb. 28, 2019

(65) Prior Publication Data
US 2021/0325444 A1    Oct. 21, 2021

(51) Int. Cl.
*G01R 31/26* (2020.01)
*G01R 31/3181* (2006.01)

(52) U.S. Cl.
CPC ..... *G01R 31/2635* (2013.01); *G01R 31/3181* (2013.01)

(58) Field of Classification Search
None
See application file for complete search history.

(56) References Cited

U.S. PATENT DOCUMENTS

| 4,686,641 A | 8/1987 | Evans |
| 7,875,998 B2 * | 1/2011 | Ting ......................... G09G 3/36 307/140 |

(Continued)

FOREIGN PATENT DOCUMENTS

| CN | 101309304 A | 11/2008 |
| CN | 202019408 U | 10/2011 |

(Continued)

OTHER PUBLICATIONS

English Translation of CN-108701073-A (Year: 2018).*

(Continued)

*Primary Examiner* — Jermele M Hollington
(74) *Attorney, Agent, or Firm* — Vivacqua Crane, PLLC

(57) ABSTRACT

Disclosed are an facilitating debugging electronic device, system and method, reasonably integrates the power-supply interface and the signal interface of the electronic device, matches the conventional output end of the electronic device with the master device, realizes the debugging of electronic devices including semi-finished products of PACKAGE (SMD)/PCBA/COB modules and electronic products, partly overcomes the technical problem of the increase of product volume and cost, which caused by setting different interfaces on electronic devices for various testing, burning and correcting purposes. The present disclosure also partly realizes the debugging of electronic devices with fewer external interfaces, which contributes to the miniaturization of electronic devices such as semi-finished products of PACKAGE (SMD)/PCBA/COB modules and electronic products, and guarantees the quality of electronic products by implementing the waterproof, dustproof and pleasing design of the housing structure of devices and achieves economic and social benefits.

18 Claims, 39 Drawing Sheets

(56) References Cited

U.S. PATENT DOCUMENTS

| | | | |
|---|---|---|---|
| 7,881,907 B2 | | 2/2011 | Curt et al. |
| 10,856,374 B2 | * | 12/2020 | Chong ................. H05B 47/185 |
| 2009/0268493 A1 | * | 10/2009 | Wu ........................... G06F 1/24 |
| | | | 363/84 |
| 2013/0156064 A1 | | 6/2013 | Xu et al. |

FOREIGN PATENT DOCUMENTS

| | | | | |
|---|---|---|---|---|
| CN | 103175704 | A | | 6/2013 |
| CN | 203278823 | U | | 11/2013 |
| CN | 205121326 | U | | 3/2016 |
| CN | 206020363 | U | | 3/2017 |
| CN | 206243509 | U | | 6/2017 |
| CN | 108701073 | A | * 10/2018 | ............. G01R 31/00 |

OTHER PUBLICATIONS

Translation of foreign patent CN 203278823 U (Year: 2013).*
Chinese National Intellectual Property Administration. First Office Action, CN Application No. 201780004650.5, dated Dec. 2, 2020, pp. 1-7, China.
Chinese National Intellectual Property Administration. Search Report, CN Application No. 201780004650.5, pp. 1-2, China.
Chinese National Intellectual Property Administration. Second Office Action, CN Application No. 201780004650.5, pp. 1-7, China.

* cited by examiner

FACILITATING DEBUGGING ELECTRONIC DEVICE, SYSTEM AND METHOD THEREOF

CROSS-REFERENCE TO RELATED APPLICATIONS

This application is a national stage application under 35 U.S.C. 371 of PCT Application No. PCT/CN2017/098336 having an international filing date of 21 Aug. 2017, the entire disclosure of which is herein incorporated by reference.

TECHNICAL FIELD

The present disclosure relates to the technical field of electronic device, in particular, relates to an electronic device and system requiring testing, program burning or correcting, and a method thereof.

BACKGROUND

Debugging: testing and/or adjusting machines, instruments and the like.

During the mass production of electronic products (includes finished electronic devices and semi-finished electronic devices of PACKAGE (SMD)/PCBA/COB stage), various, diversified and multistage testing and burning, setting, correcting are demanded.

In the existing art, common debugging methods include:

1. Connect the electronic device to be tested to a testing host through a reserved testing/correcting interface of an electronic device, and then work the corresponding testing program on the testing host. Such method requires reserved testing/correcting interfaces on the electronic devices, and therefore part of the interface resource and product area are occupied, which may increase the cost and not beneficial to the miniaturization of electronic products at the same time.

2. Reserved testing/correcting interfaces may be shared with other I/O interfaces sometimes, for fully utilizing interface resource and reduce the cost of electronic products. However, because of the variety and diversification of product applications, I/O interfaces are required to be connected to a variety of electronic components, the sharing manner of the reserved testing/correction interface and other I/O interfaces of the electronic device may be easily interfered by the external circuit, which may further influence the electric property of the reserved testing/correcting interface.

SUMMARY

To solve the above technical problems, the first aspect of the present disclosure is to provide an electronic device which saves interface resources and is highly versatile, thereby facilitating debugging.

The second aspect of the present disclosure is to provide a debugging system based on the aforementioned electronic device.

The third aspect of the present disclosure is to provide a debugging method which may be applied on the aforementioned debugging system.

According to an embodiment of the present disclosure, the following technical solutions are provided:

A facilitating debugging electronic device, including:

a power-supply interface;

a signal processing circuit; an input end of the signal processing circuit is connected to an output end of the power-supply interface. The signal processing circuit is configured for receiving and processing an access signal received from the power-supply interface, and driving an action signal output circuit to output the corresponding action signal according to the access signal;

the action signal output circuit is connected to the output end of the signal processing circuit, for outputting a detectable action signal.

Preferably, the signal processing circuit includes a rectifying unit, an input circuit, a logic operation circuit and an output circuit; and the access signal is successively transmitted through the rectifying unit, the input circuit, logic operation circuit and the output circuit, and is outputted to the action signal output circuit.

Preferably, the rectifying unit includes a positive half-wave/negative half-wave/full-wave rectifying circuit, a capacitor which is in parallel with the output end of the positive half-wave/negative half-wave/full-wave rectifying circuit, a voltage division circuit which is connected between the input end and output end of the rectifying unit; the voltage division circuit includes a pull-up/pull-down resistor and a series resistor/diode connected in series thereto; the pull-up/pull-down resistor and the series resistor/diode output signals to the input circuit after voltage division.

Preferably, the signal processing circuit further includes a storage unit, the storage unit is connected to the logic operation circuit.

Preferably, further includes a frequency/reference voltage regulating unit, which is configured for regulating the clock vibrating frequency and reference voltage of the electronic device.

Preferably, further includes a reset unit, which is used to controlling the reset and restart of the electronic device.

Preferably, the output circuit is PWM output circuit.

Preferably, the action signal output circuit is an action signal output circuit of light wave, electromagnetic wave, sound wave/ultrasonic wave or mechanical vibration wave, and correspondingly, the action signal is a signal of light wave, electromagnetic wave, sound wave/ultrasonic wave or mechanical vibration wave.

Preferably, the electronic devices may be LED light, LDO, LVD, charging management IC, wireless radio frequency module, voice IC, single-chip microcomputer MCU, memory, sensor, servo, servo motor and other chips and devices with fewer pins; and the electronic devices may also be LED light bulb, LED light bead, LED light string, LED light strip, LED light belt, copper-wire LED light, copper-string LED light, LED net light, LED curtain light, LED meteor light, LED light tube, LED scoreboard, LED indicator board, LED advertising board, LED display screen, LED monitor and other LED light products configured for decoration, illumination, emergency, caution, instruction, command, displaying information and etc. The electronic devices may also be watches, bracelets, gloves, necklaces, chokers, glasses, helmets, badges, armbands, belts, waistcoat, vests, backpacks, headphones, shoes with LCD/LED and other wearable electronic devices. The electronic devices may also be remote control, dancing machine, game console, game controller, digital pen, graphics tablet, mouse, light gun, light saber, flashing stick, cheering stick, baton, flashlight, massager, wireless walkie-talkie, calculator, score indicator, counter, electronic cigarette, mobile power bank, beauty or hairdressing and other handheld electronic devices. The electronic devices may also be walkie talkie, building walkie talkie, door lock, smart lock, Passive Infra-red Ray (PIR), door & window sensor, temperature and humidity sensor, smoke alarm, alarm, wireless switch, smart gateway, timer, telephone exchanger, humidifier, mistorizer, ultrasonic cleaner, aerosol dispenser, massage chair, footbath machine and other electric devices.

The electronic devices may also be electronic scale, electronic sphygmomanometer, ear thermometer, electronic thermometer, electronic hygrometer, watt hour meter, diastimeter and other electronic measuring equipments. The electronic devices may also be music alarm clock, navigator, ordering machine, remote control car, remote control boat, remote control aircraft, robot, voice control light, LED candle light, LED night lamp, LED bedside lamp, wireless switch, music bedside alarm, music box, music crystal ball, smart pillow, electric toothbrush, voice toothbrush, electronic musical instrument, electronic cards, electronic building blocks, electronic toy, electronic education equipment, action movement, voice doll, electronic fish, electronic turtle, electronic jellyfish, electronic coded lock and other electronic products.

Obviously, the electronic devices are not limited to the aforementioned, and further includes semi-finished products of PACKAGE (SMD)/PCBA/COB modules and other electronic products which are not listed here one by one.

Preferably, the electronic device is a LED light bead, and the LED light bead includes a housing and the power-supply interface which extends to exterior of the housing, and the power-supply interface includes a negative electrode pin and a positive electrode pin, and interior of the housing is provided with a negative electrode support and a positive electrode support, and the negative electrode support is provided with the signal processing circuit, and the positive electrode support is provided with the LED serving as the action signal output circuit.

A system for debugging electronic device includes the facilitating debugging electronic device and a master device, wherein the master device includes a master processing circuit and a testing device; the master processing circuit is configured for outputting an access signal to a power-supply interface of the electronic device; the testing device includes a sensing element, the sensing element is configured correspondingly to the action signal output circuit of the electronic device; the testing device is used to detecting the detectable action signal outputted by the action signal output circuit of the electronic device, and converting the action signal into electric signal for transmitting back to the master processing circuit.

Preferably, the master processing circuit includes an input circuit, a logic operation circuit and an output circuit; the input circuit is connected to the logic operation circuit, the logic operation circuit is connected to the output circuit, the output circuit is configured for outputting the access signal to the power-supply interface of the electronic device, the input circuit is configured for receiving the electric signal transmitted back from the testing device.

Preferably, the master device further includes a driving circuit, the output circuit outputs the access signal to the power-supply interface of the electronic device through the driving circuit.

Preferably, the driving circuit is a voltage follower, which is configured for enhancing the output driving ability of the output circuit of the master device.

Preferably, the master processing circuit further includes a storage unit, a frequency/reference voltage regulating unit and a reset unit, the storage unit is connected to the logic operation circuit, the frequency/reference voltage regulating unit is configured for regulating the clock vibrating frequency of the master device, the reset unit is configured for controlling the reset and restart of the master device.

Preferably, the action signal output circuit is an action signal output circuit of light wave, electromagnetic wave, sound wave/ultrasonic wave or mechanical vibration wave, and correspondingly, the sensing element is a sensing element of light wave, electromagnetic wave, sound wave/ultrasonic wave or mechanical vibration wave.

Preferably, the system further includes a plurality of electronic devices, which are successively connected in series/parallel, and correspondingly, the master device includes a plurality of testing devices which are configured for detecting the detectable action signal outputted by the action signal output circuit of each electronic device, the output end of each testing device is connected to the input end of the master processing circuit.

Preferably, the plurality of electronic devices are successively connected in series, the signal processing circuit comprises a rectifying unit, and a voltage stabilizing diode is parallel connected in reverse between the positive electrode and negative electrode of an output end of the rectifying unit or at the power-supply interface of the electronic device.

A method for debugging electronic device, which is applied in the system for debugging electronic device, the method includes steps of:

Step 1, a master device outputting an access signal for debugging to a power-supply interface of an electronic device by a master device;

Step 2, the electronic device receiving the access signal through the power-supply interface and driving an action signal output circuit to output a corresponding action signal according to the access signal, by the electronic device;

Step 3, the master device detecting the detectable action signal outputted by the action signal output circuit of the electronic device by a testing device, and then converting the action signal into an electric signal and transmitting back to a master processing circuit for processing, by the master device.

Preferably, the Step 3 includes sub-steps:

Step 31, the master device detects the detectable action signal outputted by action signal output circuit of the electronic device by a testing device, and then converting the action signal into the electric signal for transmitting back to the master processing circuit;

Step 32, according to the electric signal acquired from step 31, a logic operation circuit of the master processing circuit calculates signal parameters of the action signal outputted by the action signal output circuit of the electronic device;

Step 33, comparing the signal parameters acquired from step 32 with a preset reference value, obtaining a deviation value, if the deviation value is within a preset range, move to Step 8, otherwise move to Step 4;

the method further includes steps:

Step 4, through an output circuit, the master device modulates the access signal and transmitting the deviation value to the electronic device;

Step 5, after receiving the deviation value in Step 4, the electronic device writes the value into a storage unit thereof;

Step 6, the master device resets and restarts the electronic device though the output circuit thereof;

Step 7, after resetting, the electronic device adjusts the signal parameters of the action signal outputted by the output circuit according to the deviation value read from the storage unit of electronic device, and back to executing Step 1 to Step 3.

Step 8, confirming the signal parameters of the action signal outputted by the electronic device within the preset requirement(range).

Preferably, the signal parameters include a reference voltage, a frequency and a period corresponding to the action signal.

Preferably, the method further includes steps:

Step 9, after confirming the signal parameters of the action signal outputted by output circuit within the preset requirement(range), the master device conducts writing-in setting to electronic device.

Preferably, the method further includes steps:

Step 10, separating the electronic device from the master device to enable the electronic device to work independently after power-on.

Preferably, the method further includes steps: using a frequency/reference voltage regulating unit to matching the clock vibrating frequency of the electronic device to the clock vibrating frequency of the master device.

The advantageous effects of the present disclosure are as follows:

The present disclosure reasonably integrates the power-supply interface and the signal interface of the electronic device, matches the conventional output end of the electronic device with the master device, realizes the debugging of electronic devices including semi-finished products of PACKAGE (SMD/PCBA/COB modules and electronic products, partly overcomes the technical problem of the increase of product volume and cost, which caused by setting different interfaces on electronic devices for various testing, burning and correcting purposes. The present disclosure also partly realizes the debugging of electronic devices with fewer external interfaces, which contributes to the miniaturization of electronic devices such as semi-finished products of PACKAGE (SMD)/PCBA/COB modules and electronic products, and guarantees the quality of electronic products by implementing the waterproof, dust-proof and pleasing design of the housing structure of devices and achieves economic and social benefits.

The present disclosure can be widely used in the debugging of various electronic products and the system thereof.

BRIEF DESCRIPTION OF THE DRAWINGS

Further descriptions for particular embodiments of the present disclosure are given below with drawings.

Figure 1:
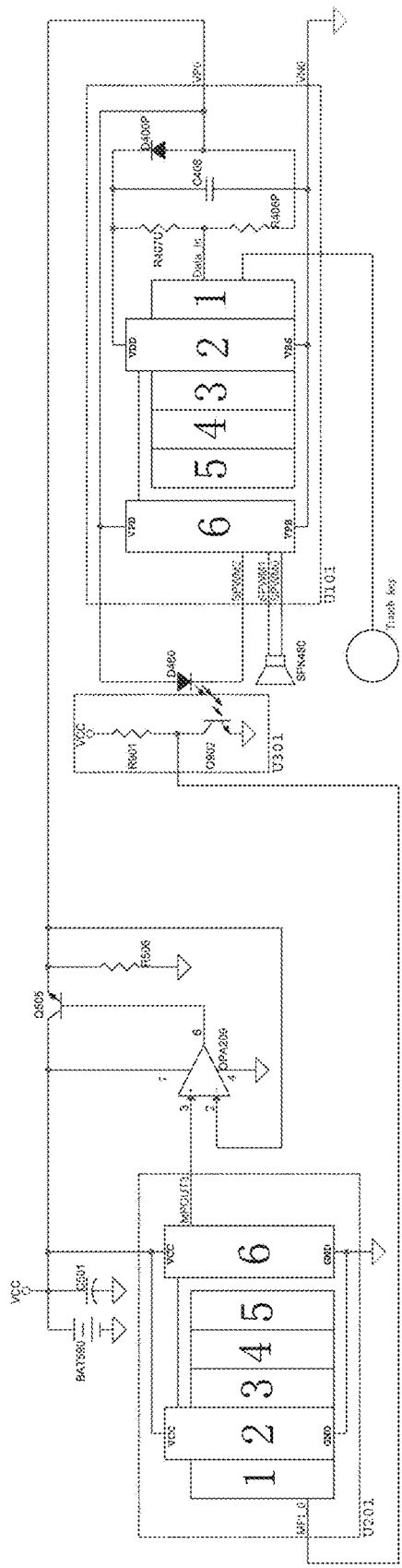
FIG. 1 is a schematic diagram of the facilitating debugging system as described in the embodiment 1A of the present disclosure.

Reference numerals: 1 Input circuit; 2 Logic operation circuit; 3 Frequency/reference voltage regulating unit; 4 Storage circuit; 5 Reset unit; 6 Output circuit.

DETAILED DESCRIPTION

It should be noted that the embodiments in the present application and the features in the embodiments may be combined with each other under the circumstances of causing no conflicts.

An overview:

The disclosure may realize the functions through the power-supply pin of the electronic device. The functions include testing, parameter correcting for voltage and frequency, high-speed data transmission, control and burning toward the electronic device by master device.

The basic idea of the disclosure is:

1. Connect the power-supply interface of the electronic device to the output circuit of the master device. The testing device connects the output circuit of the electronic device and the input circuit of the master device;

2. Use the sensing element of the master device to detect the output signal outputted by the action signal output circuit, the action signal output circuit is connected to the output circuit of the electronic device;

3. After the detected output signal of the electronic device is converted into electric signal by the testing device, the electric signal is inputted to the input circuit of the master processing circuit.

To facilitate understanding, in the embodiments listed in the present disclosure, the action signal output circuit connected with the output circuit of the electronic device, may connect to the input circuit of the master device after the electric signal conversion processed by the testing device. A person skilled in the art can also easily simplify or modify the testing device. For example, it may be simply coupling or even directly electrically connecting the input circuit of the electronic device with the input circuit of the master device. Equivalent variations of such kind should be included in the scope of claims in the present disclosure.

Multiple embodiments are described in details below to illustrate the implementing principle and process.

In the below embodiments, an installation step should be implemented at the early stage: set the master device and the electronic devices properly (the power-supply interface of the electronic device is connected to the output circuit of the master device, the action signal output circuit which is connected to the output circuit of the electronic devices is located in the accessible range of the sensing element such that the sensing element may detect the action signals of the action signal output circuits of the electronic devices).

In the below embodiments, after the system is powered on and working, the process of the controlling, status reading, testing for the electronic device by the master device includes:

1. The master device accesses the electronic device with the carrier signal modulated by the output circuit of the master device;
2. After receiving an effective access signal, the output circuit of the electronic device drives the action signal output circuit to output the corresponding action signal (light wave, electromagnetic wave, sound wave/ultrasonic wave or mechanical vibration wave), or converts the information or status or operation results inside the storage unit of electronic device into the action signal, then the action signal is outputted by the action signal output circuit which is connected to the output circuit of the electronic device;
3. After the action signal outputted by the electronic device is detected by the sensing element of the testing device, the sensing element converts the action signal into electric signal and then transmits back to the master device for confirmation;
4. Separate the electronic device from the master device to enable the electronic device to work independently after power-on, after which complete the process of the controlling, status reading and testing toward the electronic device.

It should be noted that the power supply of the electronic device may be provided by the power carrier signal outputted by the master device; or provided by an built-in battery or capacitor of the electronic device; or provided by an external power supply (or battery) connected to the power-supply interface VP0/VN0 of the electronic device.

Embodiment 1A

A debugging system for electronic devices includes a master device and an electronic device. The rectifying unit includes a positive half-wave rectifying circuit and the action signal output circuit is a LED.

As shown in FIG. 1, the system includes the master processing circuit of the master device U201, the testing device U301, the signal processing circuit of the electronic device U101, and the action signal output circuit of the electronic device D460.

The description of the master device: the master device includes the master processing circuit U201 and the testing device U301.

The master processing circuit U201 includes an input circuit, a logic operation circuit, a storage unit, a frequency/ reference voltage regulating unit, a reset unit and an output circuit. The input circuit is connected to the logic operation circuit, and the logic operation circuit is connected to the output circuit, and the output circuit is configured for outputting an access signal to the power-supply interface VP0/VN0 of the electronic device, and the input circuit is configured for receiving the electric signal transmitted back from the testing device U301. An integrated IC chip (RISC/6502/51 single-chip microcomputer, ARM microcomputer or FPGA and etc.) may be adopted to serve as the master processing circuit U201.

The master device further includes a driving circuit. The output circuit outputs the access signal through the driving circuit to the power-supply interface VP0/VN0 of the electronic device. In the present embodiment, the driving circuit is a voltage follower which includes an operational amplifier OPA209, a transistor Q505 and a resistor R506. The connection relation is shown in FIG. 1, and the function of such voltage follower is to enhance the output driving ability of the output circuit of the master device.

The testing device U301 includes a phototransistor Q902 serving as a sensing element and a bias resistor R901 which is connected in series to the phototransistor Q902. The bias resistor R901 is configured for providing a working bias to the phototransistor Q902, if a pull-up or pull-down resistor is provided within the input circuit of the master device, the bias resistor may be omitted. The phototransistor Q902 and the LED (marked as D460 in FIG. 1) are configured correspondingly, and the phototransistor Q902 is configured for detecting the detectable light wave signal outputted by the LED (marked as D460 in FIG. 1) and further converting the light wave signal into the electric signal, and transmitting back to the input end MPI_0 of the input circuit of the master processing circuit U201.

The storage unit of the master device may adopt a readable/writable storage device such as Flash or MTP or EEPROM or OTP (EPROM) or SRAM or DRAM or Register or any combination of the aforementioned.

The power-supply unit of the master device includes a power source (or a battery) BAT590, a power end VCC and a filter capacitor C501.

The description of the electronic device: the electronic device includes a power-supply interface VP0/VN0, a signal processing circuit U101, and an action signal output circuit D460. Specifically, the input end of the input circuit of the signal processing circuit U101 may connect external touch keys, through which the electronic device may receive a control instruction from users.

The signal processing circuit U101 includes a rectifying unit, a logic operation circuit, a storage unit, a reset unit, an output circuit, an input circuit, a frequency/reference voltage regulating unit (which is configured for regulating the threshold of frequency/reference with digital method). An integrated IC chip (RISC/6502/51 single-chip microcomputer, ARM microcomputer or FPGA and etc.) may be adopted to serve as the signal processing circuit of the electronic device.

The rectifying unit includes a positive half-wave circuit. The positive half-wave circuit includes a rectifying diode D400P (which may be considered as an equivalent diode inside the IC chip), a capacitor C406 which is in parallel with the output end of the rectifying diode D400P, a voltage division circuit that is connected between the output end and the input end of the rectifying diode D400P, and the voltage division circuit includes a pull-up resistor R407U (the equivalent resistance may be achieved by adopting PMOS/NMOS inside the IC chip) and a serial resistor R408P that is connected in series to the pull-up resistor R470U (the equivalent resistance may be achieved by adopting PMOS/NMOS inside the IC chip), and after voltage division, the pull-up resistor R407U and the serial resistor R408P output a signal to the input end Data_In of the input circuit. The rectifying unit receives the input signal from the power-supply interface VP0/VN0 and provides working power supply to the signal processing circuit U101 by utilizing the charge and discharge property of the capacitor C406. The disclosed circuit structure herein is simple and cost-saving.

Figure 2A:
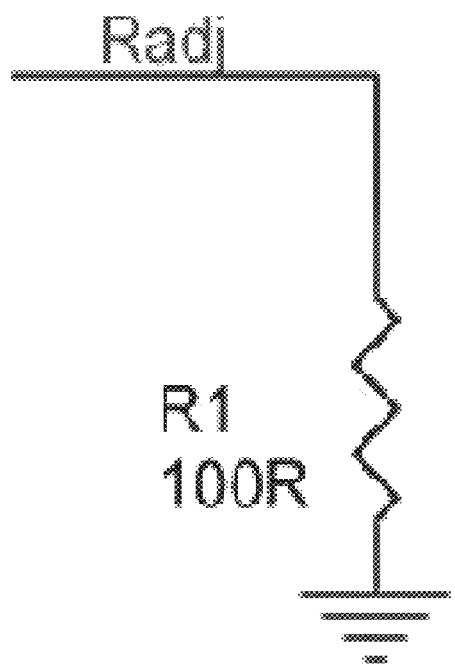
FIG. 2a is a schematic diagram of the fixed equivalent resistor for setting parameters used by frequency/reference voltage regulating unit of the facilitating debugging system as described in the embodiment 1A of the present disclosure.
Figure 2B:
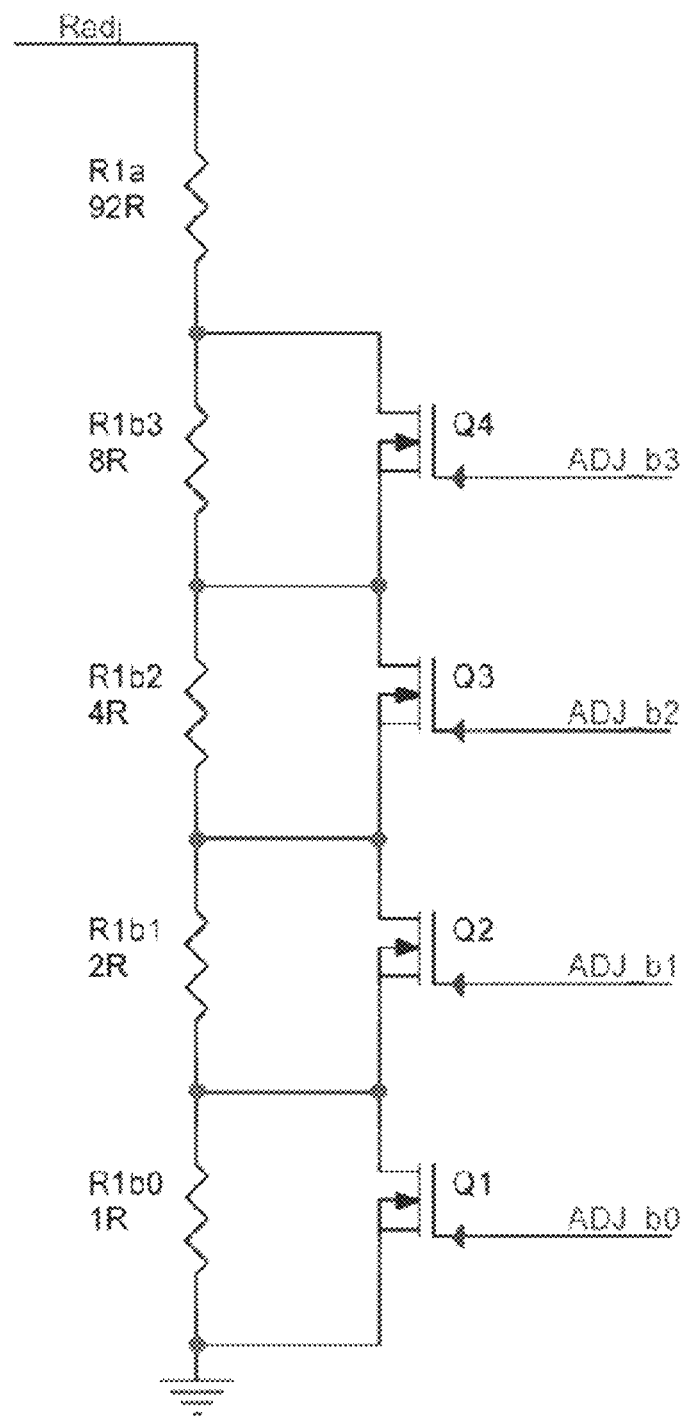
FIG. 2b is a schematic diagram of the adjustable equivalent resistor for setting parameters used by frequency/reference voltage regulating unit of the facilitating debugging system as described in the embodiment 1A of the present disclosure.

As shown in FIGS. 2a and 2b, the frequency/reference regulating unit includes an oscillation unit and a bandgap reference unit, which may provide voltage reference for LVD (low voltage detection)/LVR (low voltage reset)/ADC (analog-digital conversion)/DAC (digital-analog conversion)/LDO (low dropout regulation)/over-temperature and over-current protection/threshold adjustment and other related circuit/unit. Since the Oscillator or Bandgap circuit inside the IC chip may change the circuit output parameter according to the value change of the equivalent resistor Radj which is connected to the input end of the frequency/reference regulating unit, the frequency/reference regulating unit may regulate frequency/voltage reference with digital method. For example, R/C oscillating circuit (the change of R value leads to the change of oscillating frequency). In FIG. 2a, the resistor R1 is an fixed and non-adjustable equivalent resistor; in FIG. 2b, R1a and R1b0~R1b3 form a serial-connected adjustable equivalent resistor network, by which it is possible to input different status (111b~0000b) through different input ends to make the equivalent resistor Radj which is connected to the input end of the frequency/reference regulating unit to be an adjustable equivalent resistor with an order of 16. In the present embodiment, the adjusting range of the equivalent resistor Radj is 92R~107R, and the transistors Q1~Q4 (N-MOS transistors) showed in FIG. 2b are equivalent elements for switches, controlling the weighted value of four serial-connected resistors R1b0~R1b3 respectively.

The storage unit of the electronic device may adopt a readable/writable storage device such as Flash or MTP or EEPROM or OTP (EPROM) or Mask-ROM or Laser-Fuse or Metal-Fuse or Poly-Fuse or SRAM or DRAM or Register or any combination of the aforementioned.

Figure 3:
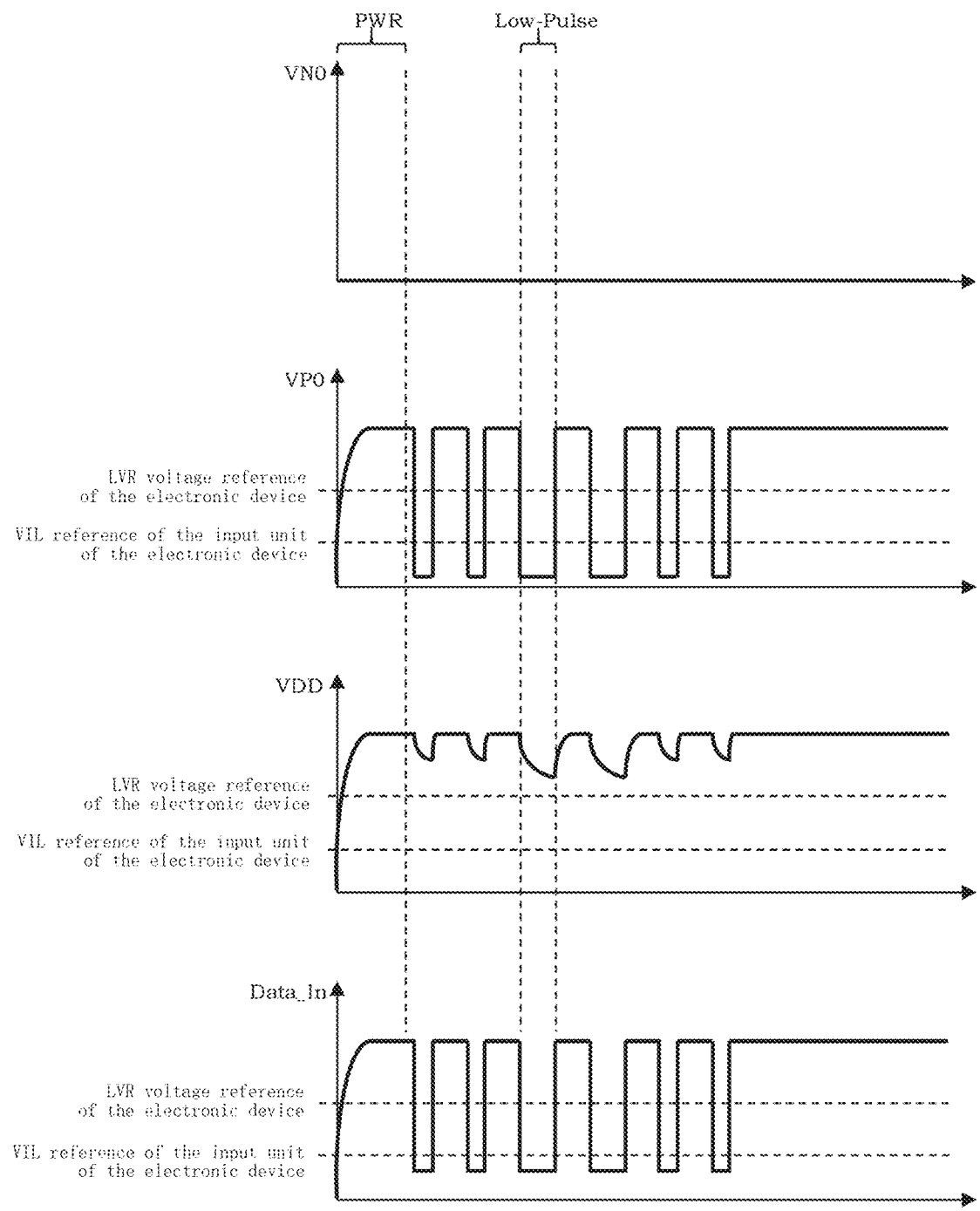
FIG. 3 is an oscillogram of the working principle of the electronic device with the facilitating debugging system as described in the embodiment 1A of the present disclosure.

In the present embodiment, the schematic diagram of the positive half-wave rectifying electronic device working principle is shown in FIG. 3. FIG. 3 includes the signal oscillograms of the negative input end VN0, the positive input end VP0 of the power-supply interface, power supply VDD, the input end Date_In of the input circuit.

The output circuit of the master device inputs a high electric potential to the positive input end VP0 and, a low electric potential to the negative input end VN0 of the electronic device power-supply interface, and VP0/VN0 charges the capacitor C406 through the diode D400P. When the stored electric potential in capacitor C406 is essentially equal to the electric potential of power-supply interface VP0/VN0, and the pull-up resistor R407U and the serial-connected resistor R408P of the input circuit of the electronic device working together to pull up the electric potential of Data_In above the VIH (Input High Voltage) reference of input circuit to enable the effective high electric potential input signal may be identified by the logic operation circuit of the electronic device, after the above state is stable for a short period of time, and then complete the PWR (Power On Reset) period of the electronic device.

Inputs a Low-Pules to VP0 of the electronic device by the output circuit of the master device or the discharging resistor R506, the power supply VDD/VSS of the electronic device is supported by discharging the stored electric energy of capacitor C406. The low electric potential on positive input end VP0 may lead to voltage division through serial-connected resistor R408P and pull-up resistor R407U, which further leads to the pulling down of input electric potential of the input end Data_In of the input circuit of the electronic device. When the electric potential inputted in Data_In is lower than the VIL (Input Low Voltage) reference of the input circuit of the electronic device, the logic operation circuit of the electronic device identifies an effective low electric potential input signal, and then pull up the electric potential of positive input end VP0, and recharges the capacitor C406 again through the diode D400P.

Figure 4:
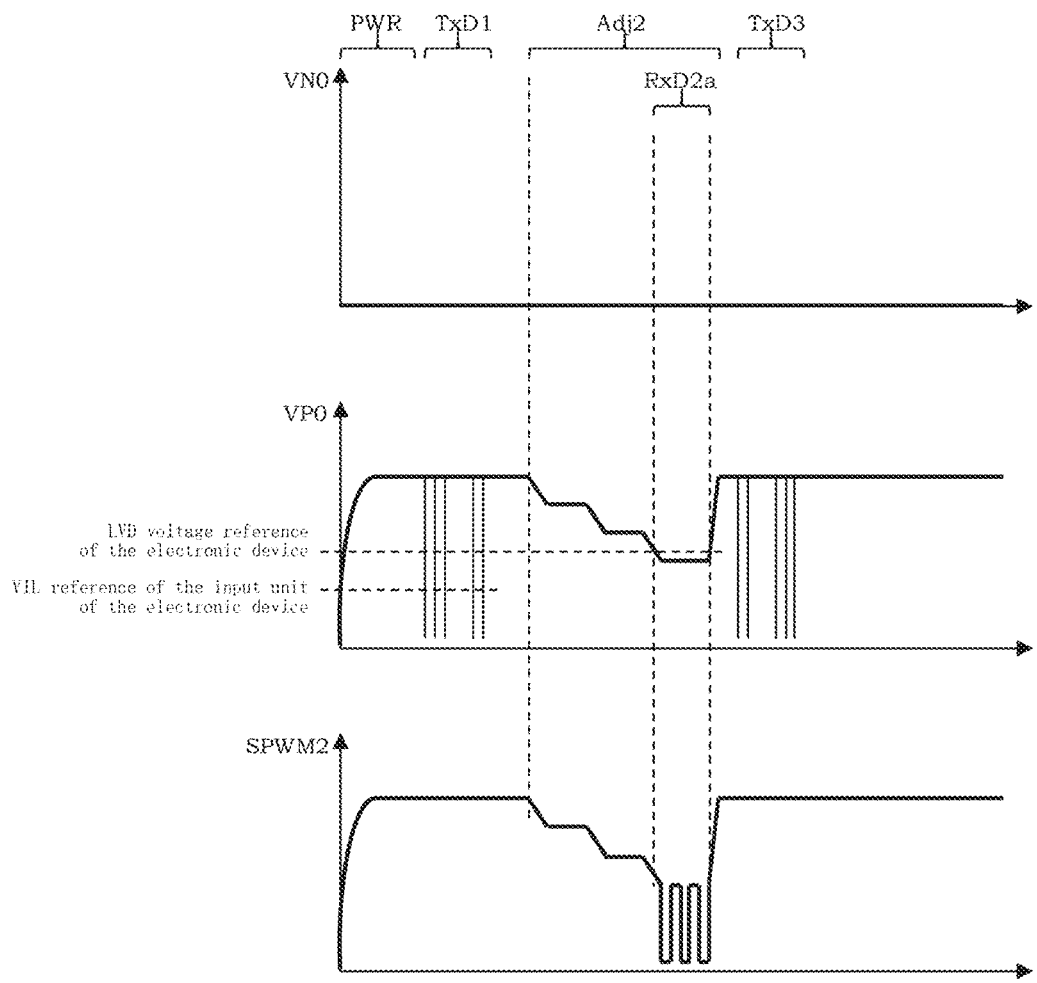
FIG. 4 is a signal oscillogram of the process of adjusting the electronic device LVD voltage parameters as described in the embodiment 1A of the present disclosure.

The embodiment of adjusting LVD (Low Voltage Detection) voltage parameter of the electronic device with a positive half-wave rectifying unit is described below in details:

The signal oscillogram of the adjustment of the electronic device LVD voltage parameter is shown in FIG. 4.

Firstly, connect the electronic device to the master device and testing device properly.

The adjusting process includes following phases:

PWR: The output circuit of the master device resetting the period of electronic device by power-on through the driving circuit.

TxD1: The output circuit of master device releases "the instruction of the output circuit of electronic device acting according to LVD voltage value" to the electronic device through the driving circuit, wherein the electric potential of inputted signal of the electronic device is required to be lower than the VIL reference of the electronic device.

Wherein, when the external input voltage of the electronic device is higher or lower than the LVD voltage value of the electronic device, the action of the output circuit of the electronic device can be configured respectively. The present embodiment adopts the action manner of the output circuit of the electronic device under the circumstance that the external input voltage of the electronic device is lower than the LVD voltage value of the electronic device for illustration.

Adj2: the output circuit of the master device, gradually changes the voltage supplied to the positive input end VP0 of the electronic device through the driving circuit, and monitors the output status of the electronic device through the sensing element on the testing device.

Wherein, the process of gradually changing the voltage supplied to the positive input end VP0 of the electronic device may be various forms such as gradual increase or gradual decrease or the Dichotomous search. The present embodiment adopts the manner of gradually decreasing the voltage supplied to the positive input end VP0 of the electronic device for illustration.

RxD2a: the electronic device monitors that the voltage value of the positive input end VP0 and the LVD satisfy the relationship, and drives the action signal output circuit to act through the output circuit.

The master device receives the outputted action signal of electronic device through the testing device, and records the value of voltage supplied to the positive input end VP0 of the electronic device and compares the value with a requirement value, a difference value can be obtained.

The master device restores the value of voltage supplied to the positive input end VP0 of the electronic device to the value which can be written to the storage unit of the electronic device through the driving circuit via the output circuit.

TxD3: If the value of LVD voltage of the electronic device cannot satisfy the specification requirement, the master device releases an "instruction of adjusting LVD voltage value" to the electronic device through the output circuit, and writes the aforementioned difference value into the storage unit of the electronic device, and the signal electric potential inputted to the electronic device is required to be lower than the VIL reference of the electronic device; if the value of LVD voltage of the electronic device satisfies the specification requirement, the step can be omitted. If checking the LVD voltage parameter status of the electronic device for the second time is required, return and execute the aforementioned adjustment process for confirmation.

Figure 5:
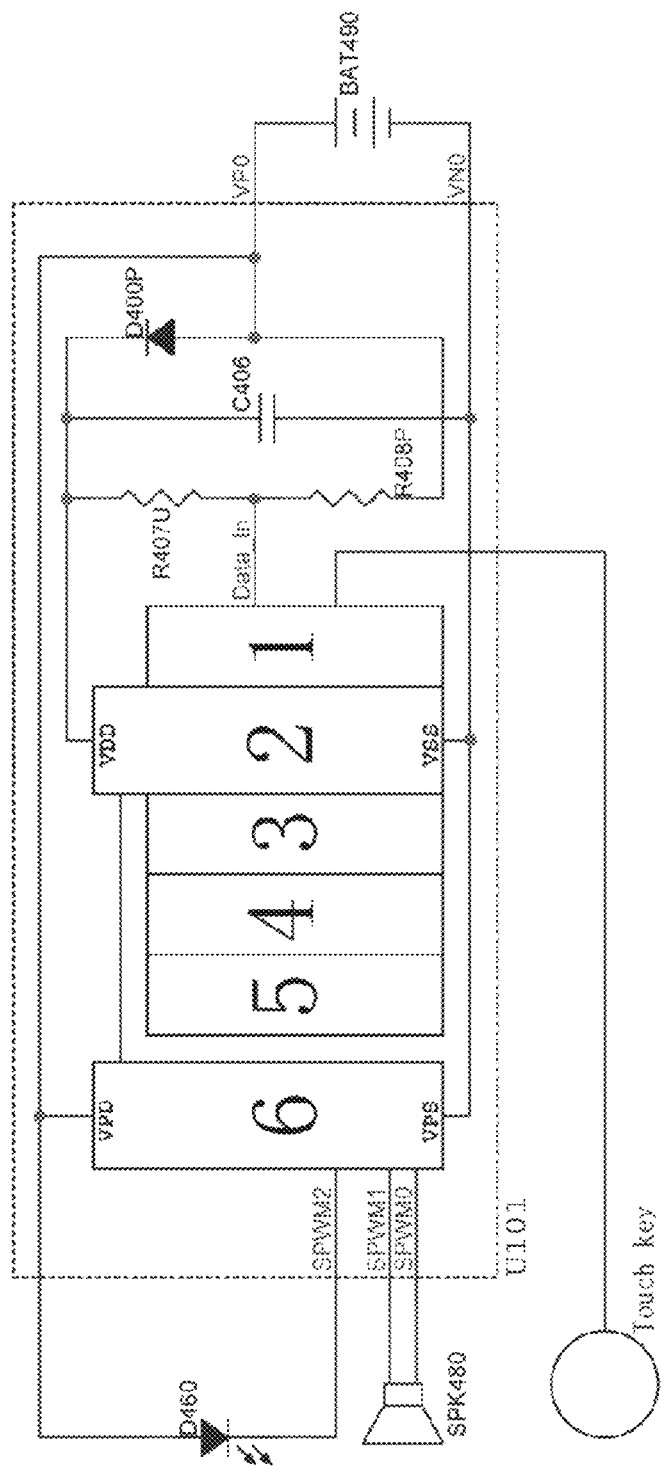
FIG. 5 is a schematic diagram of the electronic device with independent power-on as described in the embodiment 1A of the present disclosure.

After the adjustment of LVD voltage parameter of the electronic device is completed, the master device may be removed and the electronic device may work independently after power-on. As shown in FIG. 5, after separation from the testing device and the master device, the electronic device works independently after power-on, and the positive input end VP0 and the negative input end VN0 are connected to the power BAT490.

Figure 6:
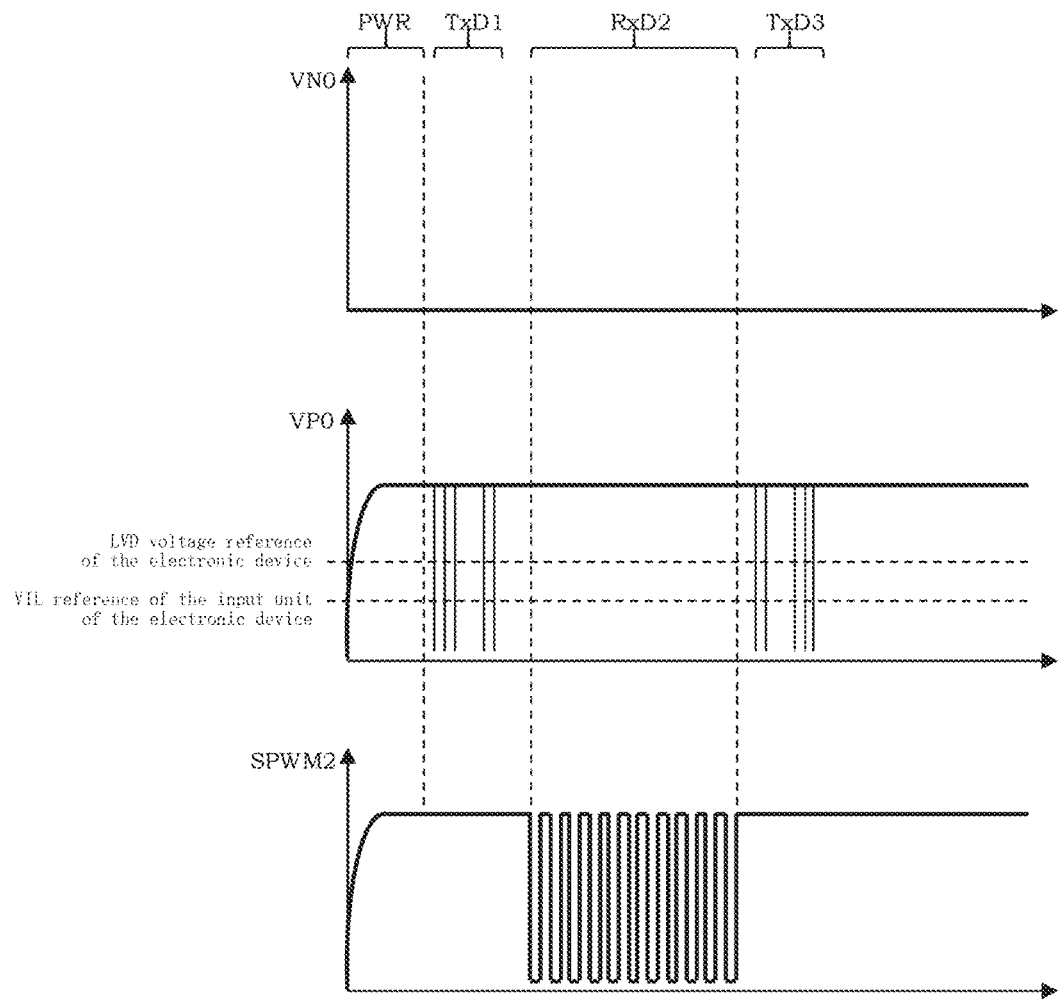
FIG. 6 is an oscillogram of adjusting the frequency/period parameters of the electronic device as described in the embodiment 1B of the present disclosure.

In the present embodiment, the master device may also obtain the period/frequency value of the electronic device by detecting the period duration of RxD2a or the frequency of the output circuit of the electronic device, and compare the period/frequency value with the required value, and obtain the difference value. In TxD3 phase, the master device releases an "instruction of adjusting LVD voltage value" to the electronic device through the output circuit, and completes the action of electronic device frequency adjustment. The oscillogram of adjusting the frequency/period parameter of the electronic device is shown in FIG. 6.

Embodiment 1B

A debugging method for electronic devices is provided and applied to the debugging system for electronic device in embodiment 1A.

In the present embodiment, after powered-on, the system starts to write in and correct parameters such as reference voltage and oscillation frequency toward the electronic device. The method includes the following steps specifically:

1. The master device accesses the electronic device with the power carrier signal (access signal) modulated by the output circuit of the master device. (During this step, the access signal may be a modulated signal with a wider error range, for example, long or short wavelength signal such as PWM (PDM)/PPM and the like.)

2. After receiving the effective access signal, the electronic device outputs a corresponding action signal (light wave, electromagnetic wave, sound wave/ultrasonic wave or mechanical vibration wave and the like) through the action signal output circuit driven by the output circuit of the electronic device, or, through the action signal output circuit connected to the output circuit of the electronic device, converts the information, status or operation results which stored in the storage unit of the electronic device into the action signal and outputs the action signal.

3. The sensing element on the testing device detects the action signal outputted by the electronic device, and converts the signal into an electric signal and then transmitting back to the master device for confirmation.

4. The logic operation circuit of the master device calculates the frequency or period value corresponding to the outputted action signal of the electronic device, and compares the result with the required frequency or period value, and obtains the difference value. If the difference value is within the required range, move to step 13, otherwise move to step 5.

5. The master device modulates power carrier signal through its output circuit and transmits the difference value to the electronic device.

6. After receiving the effective difference value, the electronic device writes such value into the internal storage unit.

7. Through its output circuit, the master device restarts the electronic device after power-on, and performs reset.

8. After being reset, the electronic device reads the different value stored in the internal storage unit, and adjusts the related parameters of the related unit (reference voltage/frequency).

9. The master device accesses the electronic device with the power carrier signal (access signal) modulated by the output circuit of the master device.

10. After receiving the effective access signal, the electronic device outputs a corresponding action signal (light wave, electromagnetic wave, sound wave/ultrasonic wave or mechanical vibration wave and the like) through the action signal output circuit driven by the output circuit of the electronic device, or, through the action signal output circuit connected to the output circuit of the electronic device, converts the information, status or operation results which stored in the storage unit of the electronic device into the action signal and outputs the action signal.

11. The sensing element on the testing device detects the action signal outputted by the electronic device, and converts the signal into an electric signal and then transmits back to the master device for confirmation.

12. The master device calculates the frequency or period of the electronic device and the difference value, if the difference value is still not within the required range, back to step 5.

13. After confirming the outputted action signal of the electronic device satisfying the requirements, the master device conducts writing-in setting to electronic device.

At this moment, the electronic device can be configured to high-speed signal-receiving modulation mode, such that the electronic device later on is able to accept the access of the master device with high-speed modulation signal (asynchronous/start-stop), which may increase transmission efficiency.

14. Separating the electronic device from the master device and the testing device, the electronic device works independently after power-on, and process of writing in and correcting of the parameters such as reference voltage and oscillation frequency toward the electronic device is completed.

Additionally, since the single-wire serial data transmission is adopted in the embodiment, no Clock signal is connected between the master device and the electronic device, so that the transmitting/receiving ends cannot obtain a completely synchronous oscillation frequency/Clock signal, therefore, the following two communications modes are usually adopted.

1. Signal modulation encoding mode such as PWM (PDM), PPM, FSK and etc.

The advantages are as follows: the Rosc (oscillation resistor) oscillation frequency/Clock signal at both ends of the transmitting/receiving can tolerate a large error range, such as +/−10%.

With above signal modulation encoding, a bit signal is permutated and combined using multiple different (period, frequency) proportional values to realize the representation of the bit signal.

Specifically, the receiving end samples the bit signal and completes the reception, and performs ratio comparison on proportional values (period, frequency) of the bit signal.

According to the duty ratio or the ratio of the frequency or the amplitude, identify the bit signal belongs to "bit 0" or "bit 1".

The disadvantages are as follows: under the same receiving and sampling conditions, the transmission efficiency of such signal modulation coding is relatively low.

2. Asynchronous (start-stop) single-wire serial communications protocol (Asynchronous Communications).

Above asynchronous communications require the Rosc oscillation frequency/Clock signal at both ends of the transmit/receive as close as possible.

Conventionally, a crystal oscillator with a specific frequency is used at the transmitting/receiving ends to minimize the error range of the Rosc oscillation frequency/Clock signal at the transmitting/receiving ends, for example, less than +/−0.5%.

The transmission efficiency of such signal modulation encoding is relatively high, but the cost is relatively high.

Assuming that there is a +/−5% error in the Rosc oscillation frequency of system at both transmitting/receiving ends. The worst case must be considered in mass production, otherwise problems of receiving incorrect data may occur. That is, it is necessary to consider the extreme application conditions such as the master device and the electronic device are with a Rosc oscillation frequency of +5% at the transmitting end and with the Rosc oscillation frequency of −5% at the receiving end, or with a Rosc oscillation frequency of −5% at the transmitting end and with the Rosc oscillation frequency of +5% at the receiving end.

Figure 7A:
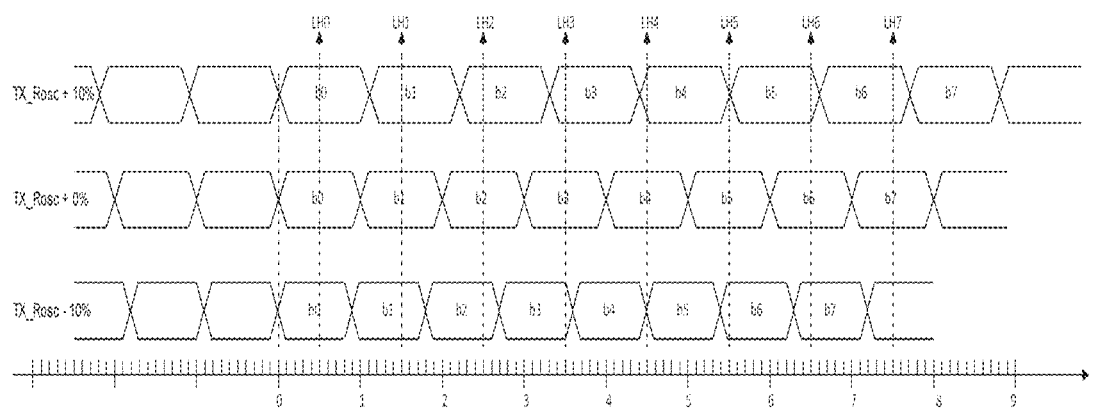
FIG. 7a and FIG. 7b is a drawing of the serial signals corresponding to different Rosc oscillation frequencies as described in the embodiment 1B of the present disclosure in comparison.

FIG. 7a is a comparison diagram of serial signals corresponding to different Rosc oscillation frequencies, in which the reading time LH0~LH7 of the receiving end is fixed.

When the transmitting end TX_Rosc is with +0% deviation, LH0~LH7 can fall in the effective reading area of the single-wire serial signal each time.

When the transmitting end TX_Rosc is with +10% deviation, LH0~LH3 barely fall in the effective reading area of the single-wire serial signal, but there is a possibility to read the error status from LH4.

When the transmitting end TX_Rosc is with −10% deviation, LH0~LH2 barely fall in the effective reading area of the single-wire serial signal, but there is a possibility to read the error status from LH3.

In FIG. 7a, the LSB (Least-Significant-Bit) mode is used and described first, and the MSB (Most-Significant-Bit) mode may be used as well, and both are equivalent changes.

Figure 7B:
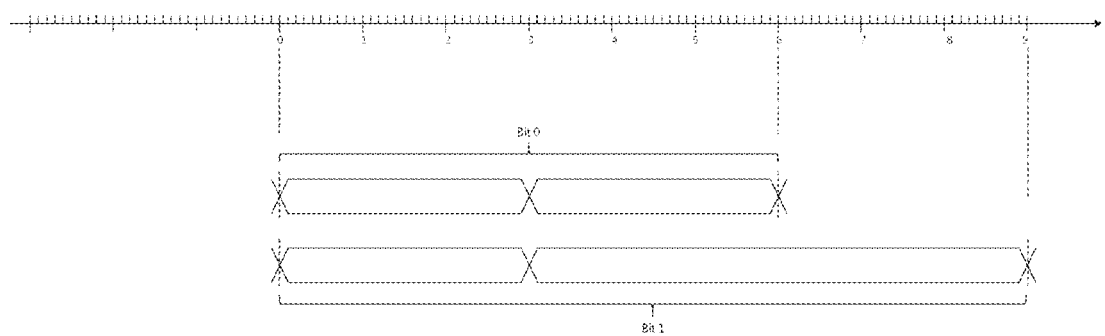

The description of PDM (PWM), PPM and other signal modulation encoding modes is shown in FIG. 7b, which can be compared with asynchronous (start-stop) single-wire serial communications protocol (Asynchronous Communications). The transmission efficiency of the modulation encoding mode is relatively low when same sampling condition performed by the receiving end. The Bit0 and Bit1 definitions in FIG. 7b are interchangeable and equivalent.

Assuming that the oscillation frequency of the master device and the electronic device has +/−10% error in mass production, it is necessary to consider the worst case when designing the transmission protocol such as +10% error at transmitting end and −10% error at receiving end, or −10% at transmitting end and +10% error at receiving end. Therefore, at least +/−20% of the error margin is needed to be reserved in receiving timing sequence of the electronic device.

In this embodiment, the error of oscillation frequency of the electronic device can be adjusted to a range very close to the master device, for example, the error range is adjusted to be less than +/−0.5%, and more orders(kinds) of data can be allowed to transmit in the same transmission period of time.

Embodiment 1C

A debugging system for electronic devices includes a master device and an electronic device. The rectifying unit includes a positive half-wave rectifying circuit and the action signal output circuit is a speaker.

Figure 8:
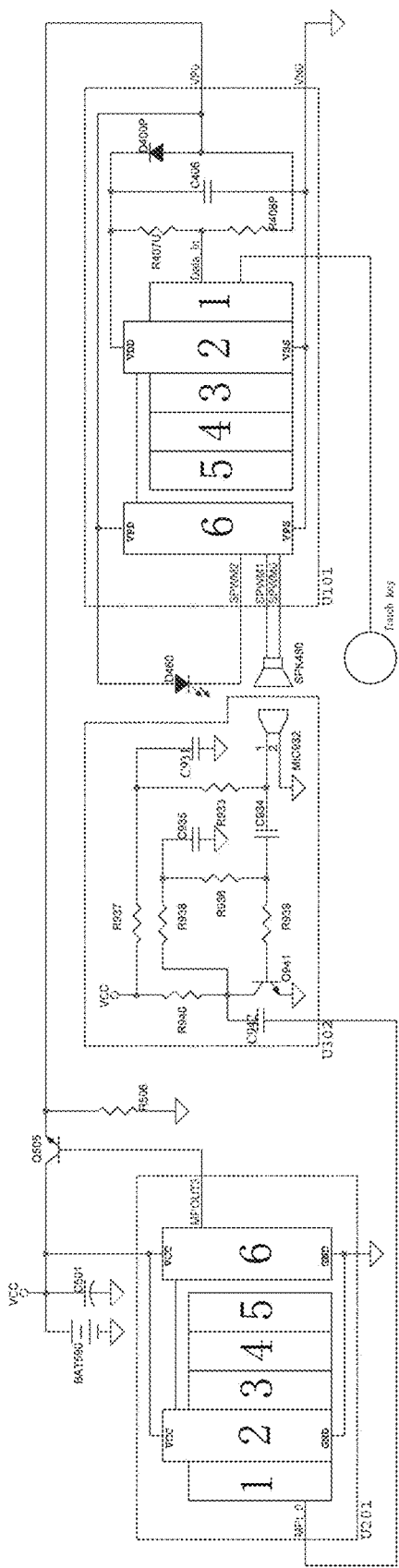
FIG. 8 is a schematic diagram of the facilitating debugging system as described in the embodiment 10 of the present disclosure.

As shown in FIG. 8, the difference between the present embodiment and embodiment 1A is: the action signal output circuit is the electronic device is changed from LED (marked as D460) to speaker SPK480. The system in the present embodiment includes a master processing circuit U201, a testing device U302, an electronic device U101, and an action signal output circuit of electronic device SPK480.

The sensing element on the testing device U302 is microphone MIC 932. The testing device U302 includes a microphone pre-stage signal amplification circuit composed of a capacitor C931, a resistor R933, a capacitor C934, a capacitor C935, a resistor R936, a resistor R937, a resistor R938, a resistor R939, a resistor R940, a transistor Q941, and a capacitor C942, and the purpose is to amplify the signal received by the microphone MIC 932 and transmit it to the input end of the master device.

Figure 9:
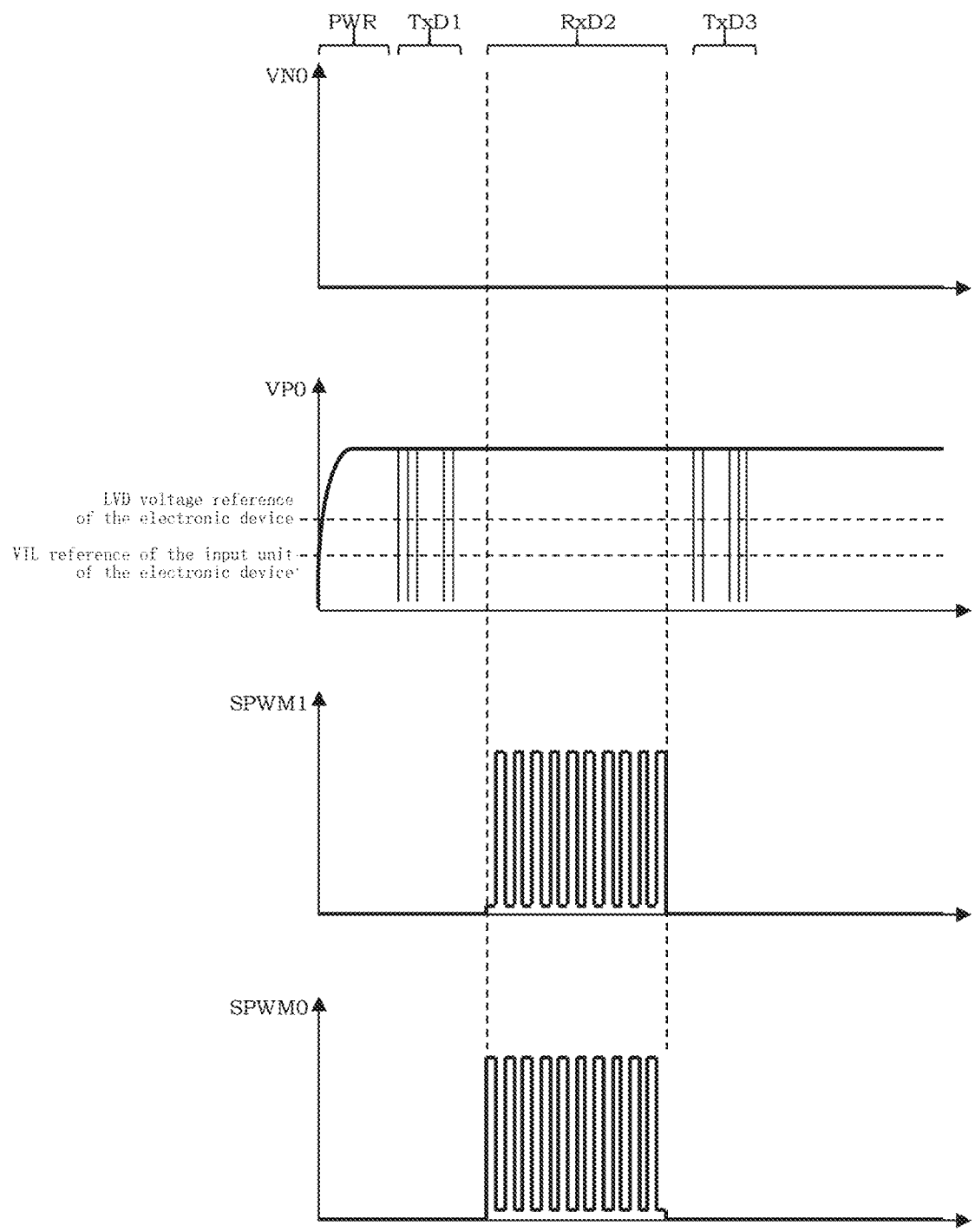
FIG. 9 is a signal oscillogram schematic diagram corresponding to the facilitating debugging system as described in the embodiment 10 of the present disclosure.

A schematic diagram of a signal waveform corresponding to the present embodiment is shown in FIG. 9. The figure describes the signal waveform correspondence relationship of the negative input end VN0, the positive input end VP0 of the power-supply interface and the output end SPWM0/SPWM1 of the output circuit. The working principle of this embodiment is similar to that of Embodiment 1A, and the details are not described herein.

Embodiment 1D

A debugging system for electronic devices includes a master device and an electronic device. The rectifying unit includes a positive half-wave rectifying circuit and the action signal output circuit is a LED, the electronic device has a built-in rechargeable battery or capacitor.

Figure 10A:
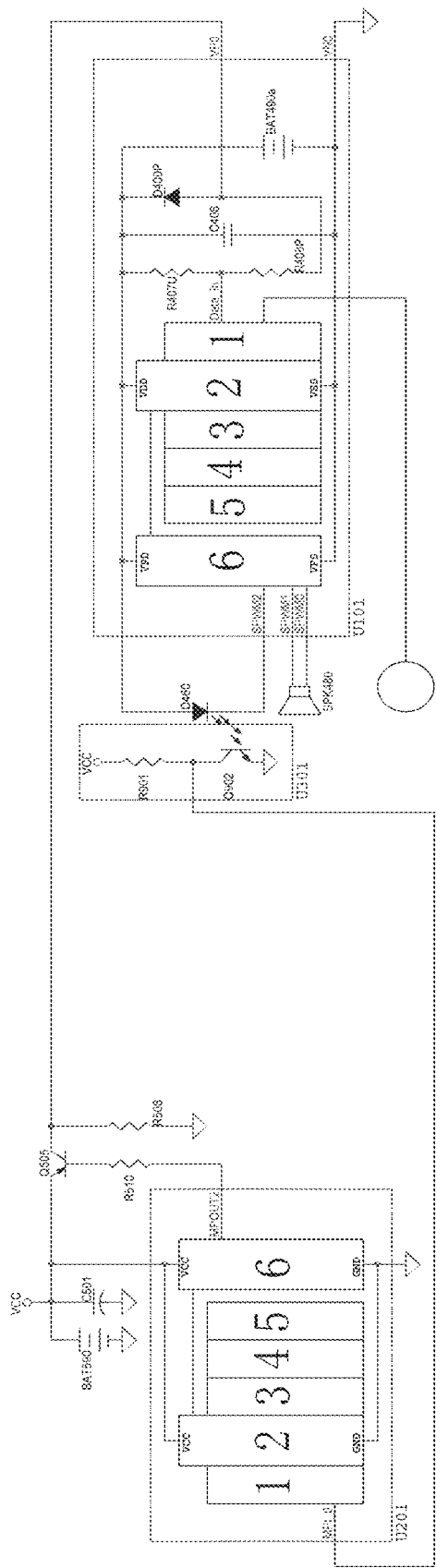
FIG. 10a is a schematic diagram of the facilitating debugging system as described in the embodiment 1D of the present disclosure.

As shown in FIG. 10*a*, the difference between the present embodiment and embodiment 1A is: the electronic device has a built-in rechargeable battery or capacitor.

Figure 10B:
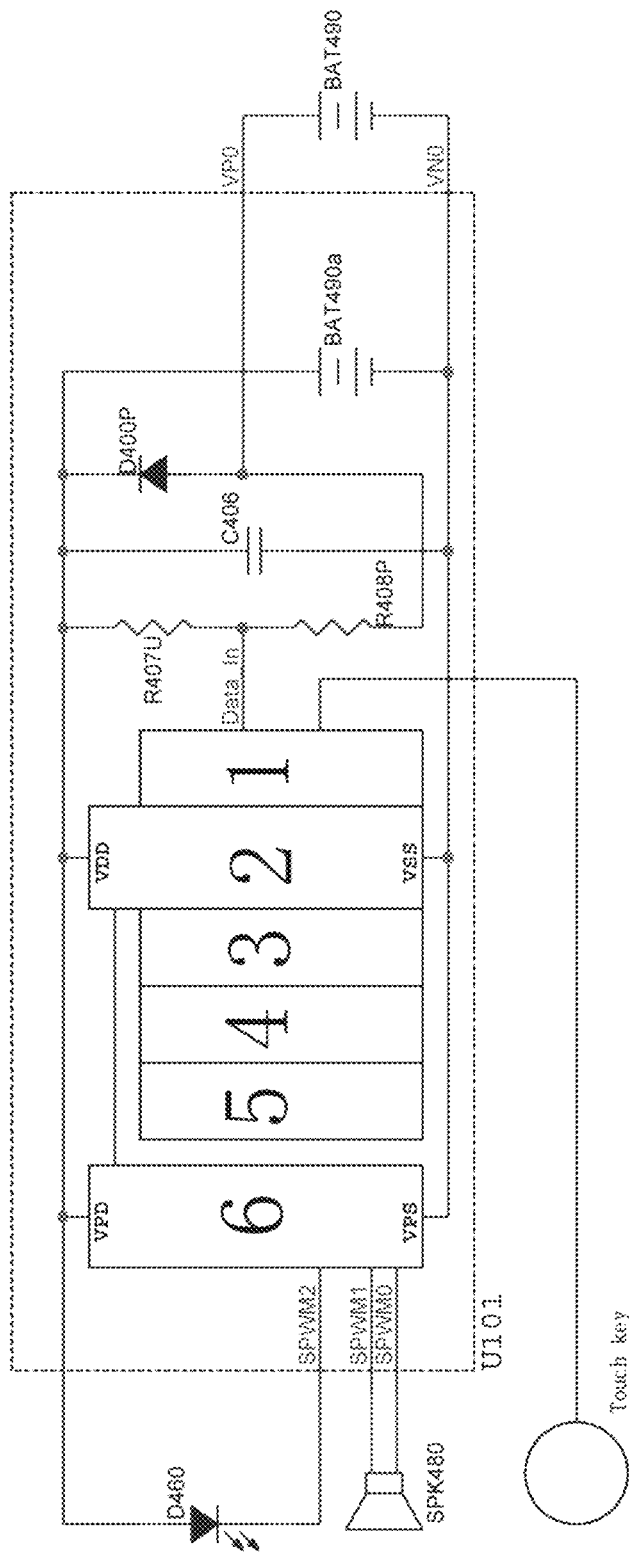
FIG. 10b is a schematic diagram of the electronic device with independent power-on as described in the embodiment 1D of the present disclosure.

As shown in FIG. 10*b*, after the operation of the electronic device is completed, the master device can be removed, the electronic device works independently by using the built-in rechargeable battery BAT490*a* or a capacitor, or the positive input end VP0 and the negative input end VN0 of the electronic device are connected to the external power-supply BAT490.

In the present embodiment, the rechargeable battery BAT490*a* or the capacitor is connected in parallel to both ends of the power-supply VDD/VSS of the electronic device, and the external power-supply BAT490 can charge the rechargeable battery BAT490*a* or the capacitor built in the electronic device.

Embodiment 1E

A debugging system for electronic devices includes a master device and an electronic device. The rectifying unit includes a positive half-wave rectifying circuit and the action signal output circuit is a LED, the electronic device has a built-in battery.

Figure 11A:
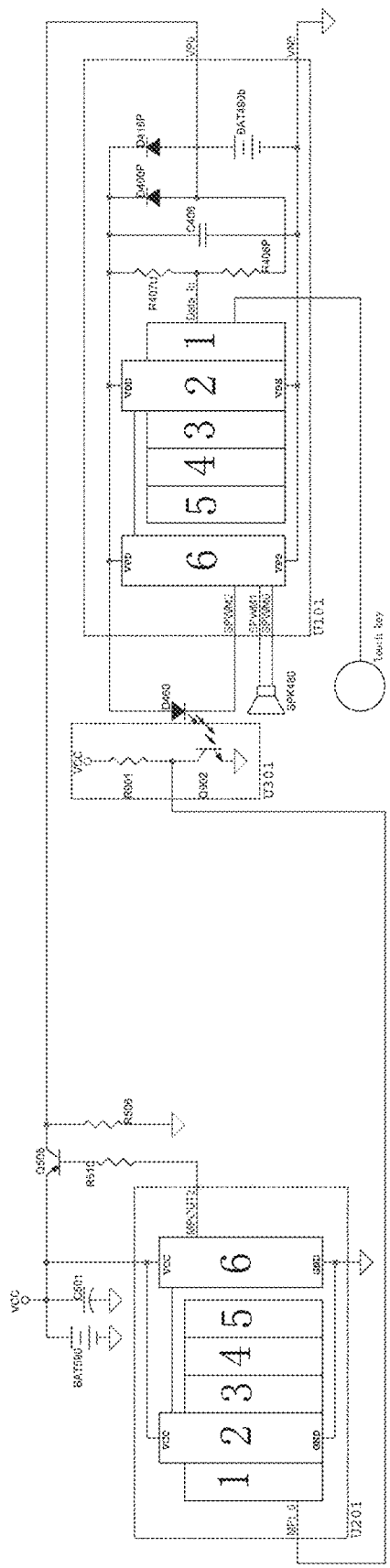
FIG. 11a is a schematic diagram of the facilitating debugging system as described in the embodiment 1 E of the present disclosure.

As shown in FIG. 11*a*, the difference between the present embodiment and embodiment 1A is: the electronic device has a built-in battery.

Figure 11B:
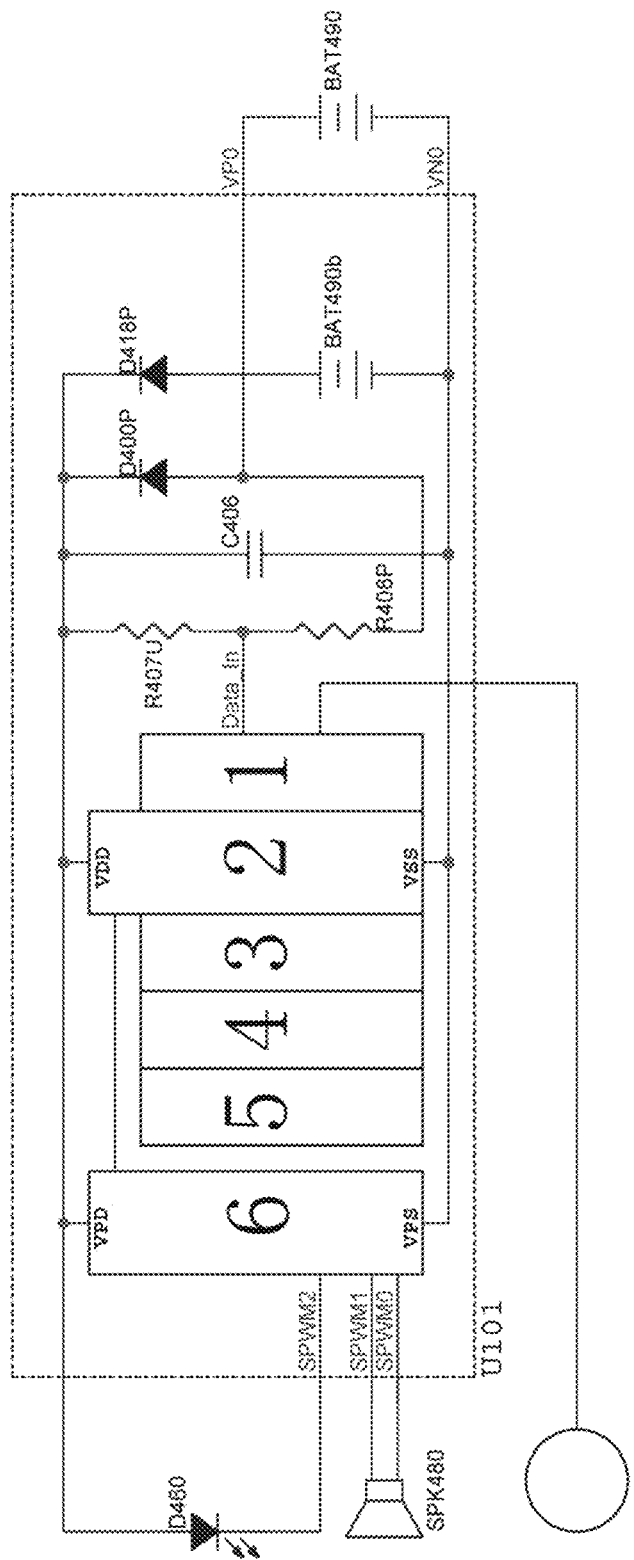
FIG. 11b is a schematic diagram of the electronic device with independent power-on as described in the embodiment 1E of the present disclosure.

As shown in FIG. 11*b*, after the operation of the electronic device is completed, the master device can be removed, the electronic device works independently by using the built-in battery BAT490*b*, or the positive input end VP0 and the negative input end VN0 of the electronic device are connected to the external power-supply BAT490.

The built-in battery BAT490*b* is connected in series to the diode D418P first and then connected in parallel to the both ends of the power-supply VDD/VSS of the electronic device to prevent the external power-supply BAT490 from interacting with the built-in battery BAT490*b*.

In the present embodiment, the voltage of the external power-supply BAT490 is generally slightly higher than the voltage of the built-in battery BAT490*b*. The purpose of the design is that when the electronic device is connected to the external power source BAT490, the system power consumption of the electronic device can be mainly provided by the external power source BAT490, and the power consumption of the built-in battery BAT490*b* of the electronic device can be minimized.

Embodiment 2A

A debugging system for electronic device includes a master device and an electronic device. The rectifying unit includes a negative half-wave rectifying circuit, and the action signal output circuit is a LED.

Figure 12:
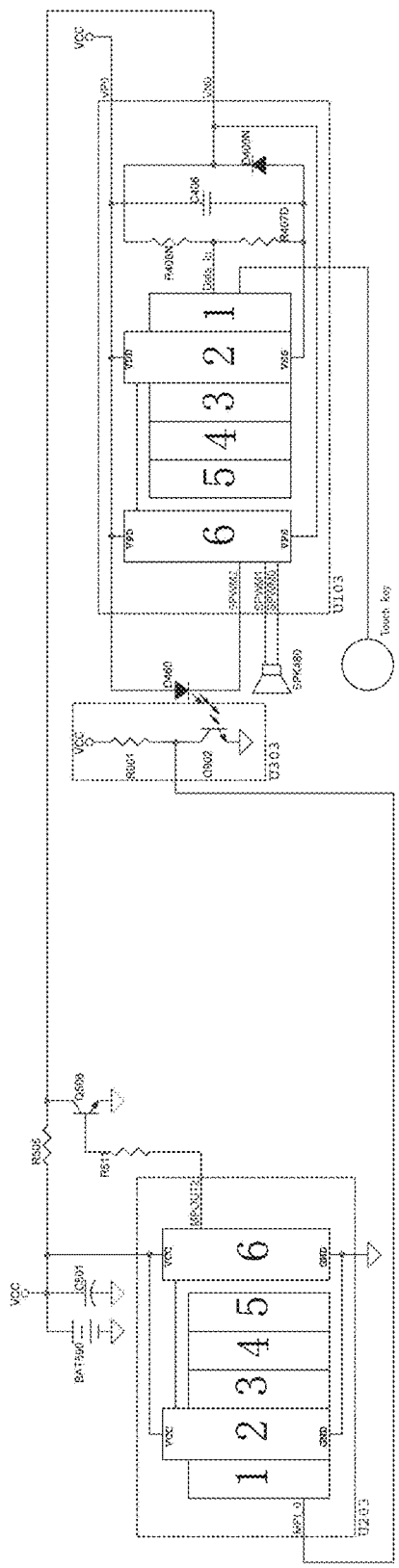
FIG. 12 is a schematic diagram the facilitating debugging system as described in the embodiment 2A of the present disclosure.
Figure 13:
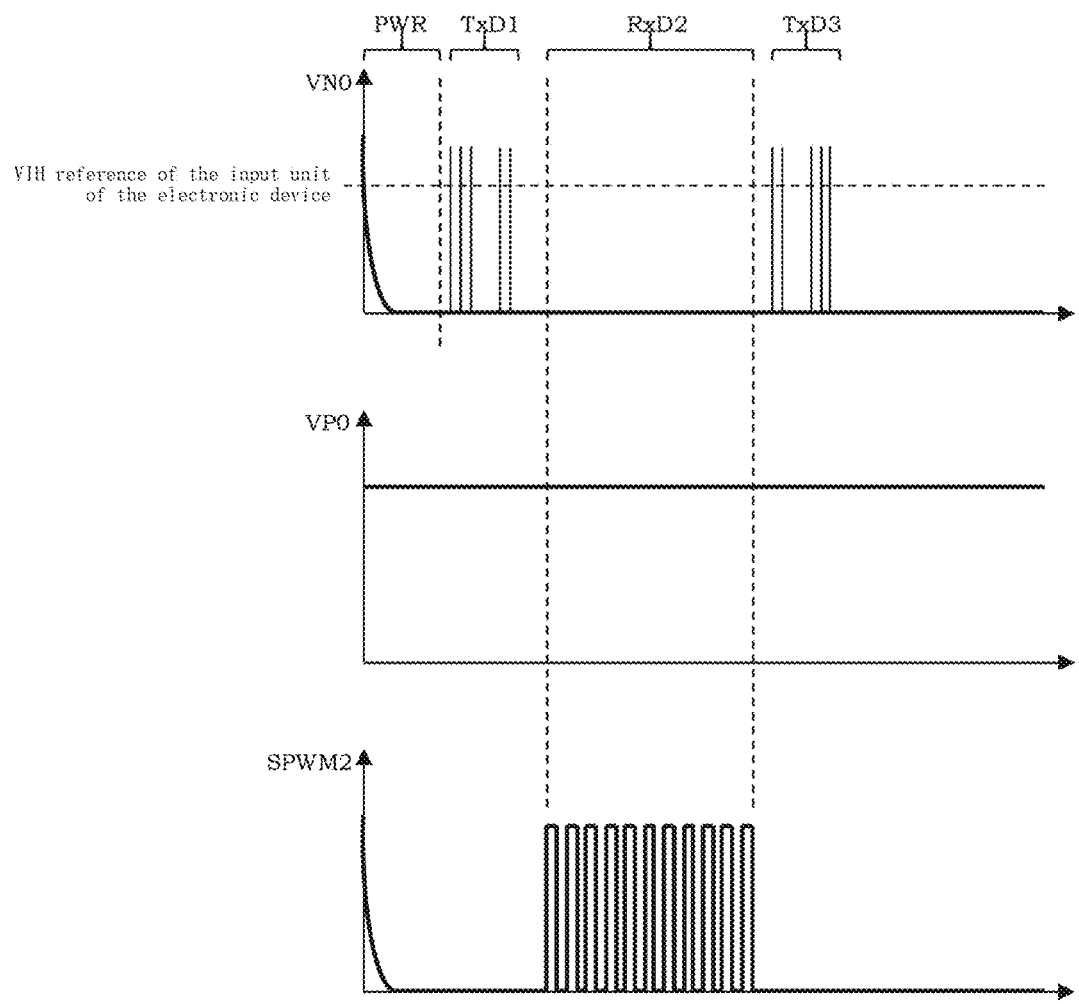
FIG. 13 is a signal oscillogram of the electronic device parameter debugging process as described in the embodiment 2A of the present disclosure.

The schematic diagram of the present embodiment is shown in FIG. 12. The master device includes the master processing circuit U203 and a testing device U303, and the electronic device includes the signal processing circuit U103. The difference between the present embodiment and the embodiment 1A is that the rectifying unit includes a negative half-wave rectifying circuit, and the parameter debugging waveform corresponding to the present embodiment is shown in FIG. 13. FIG. 13 includes signal waveforms of the negative input end VN0, the positive input end VP0 and the output end SPWM2 of the output circuit of the electronic device. The working processes of PWR, TxD1, RxD2, and TxD3 are similar to the adjustment working process of Embodiment 1A, and the details are not described herein.

Figure 14:
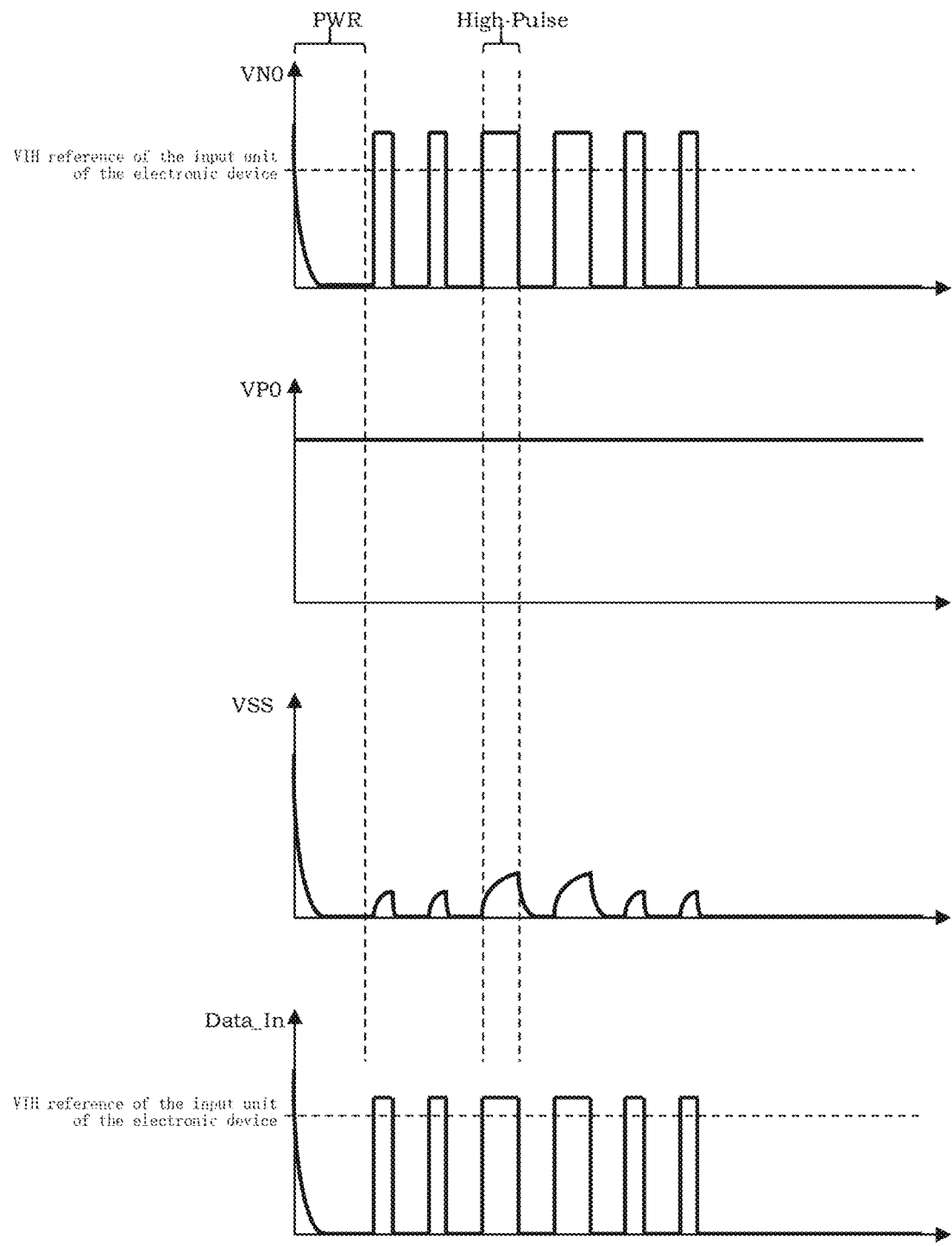
FIG. 14 an oscillogram of the working principle of the electronic device with the facilitating debugging system as described in the embodiment 2A of the present disclosure.

The schematic diagram of the negative half-wave rectifying electronic device is shown in FIG. 14. The output circuit of the master device inputs a high electric potential to the positive input end VP0, and a low electric potential to the negative input end VN0 of the power-supply interface of the electronic device, and the power-supply interface VP0/VN0 charges the capacitor C406 through the diode D400N. When the stored electric potential in capacitor C406 is essentially equal to the electric potential of power-supply interface VP0/VN0, and the pull-down resistor R407D and the serial-connected resistor R408N of the input circuit of the electronic device working together to pull down the electric potential of Data_In below the VIH (Input High Voltage) reference of input circuit to enable the effective low electric potential input signal identified by the logic operation circuit of the electronic device, after the above state is stable for a short period of time, and then complete the PWR (Power on Reset) period of the electronic device.

Inputs a High-Pules to VN0 of the electronic device by the output circuit of the master device or the discharging resistor R506, the power supply VDD/VSS of the electronic device is supported by discharging the stored electric energy of capacitor C406. The high electric potential on negative input end VN0 may lead to voltage division through serial-connected resistor R408N and pull-up resistor R407D, which further leads to the pulling up of input electric potential of the input end Data_In of the input circuit of the electronic device. When the electric potential inputted to the input end Data_In is higher than the VIH (Input High Voltage) reference of the input circuit of the electronic device, the logic operation circuit of the electronic device identifies an effective high electric potential input signal, and then pull down the electric potential of negative input end VN0, and recharges the capacitor C406 again through the diode D400P.

Embodiment 2B

A debugging system for electronic device includes a master device and an electronic device. The rectifying unit includes a negative half-wave rectifying circuit, and the action signal output circuit is a speaker.

Figure 15:
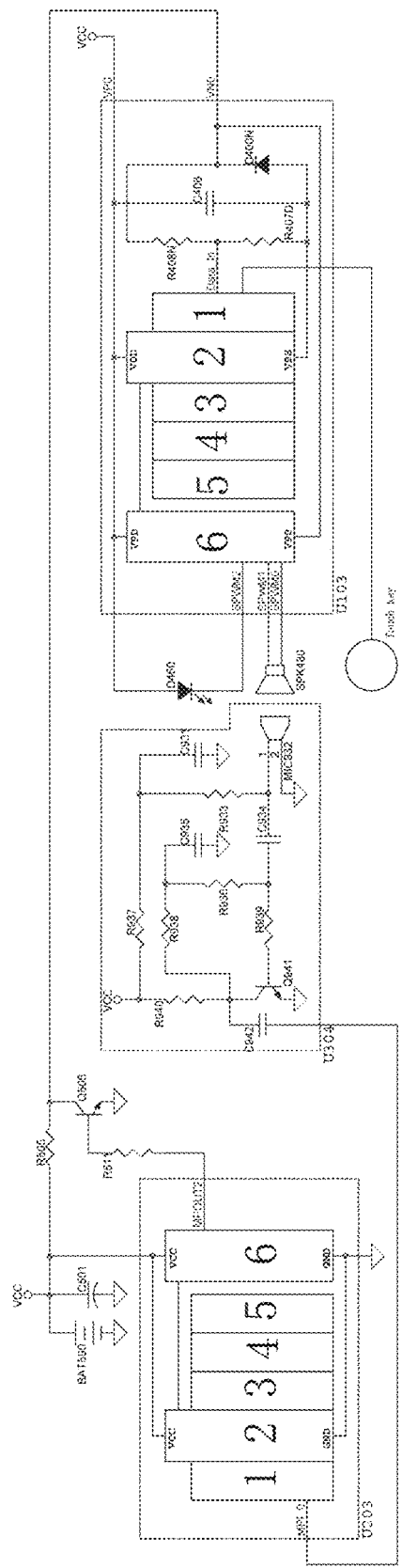
FIG. 15 is a schematic diagram of the facilitating debugging system as described in the embodiment 2B of the present disclosure.

As shown in FIG. 15, the difference between the present embodiment and embodiment 2A: the action signal output circuit of the electronic device is changed from LED (marked as D460) to speaker SPK480, and the sensing element on the testing device is microphone MIC932.

Figure 16:
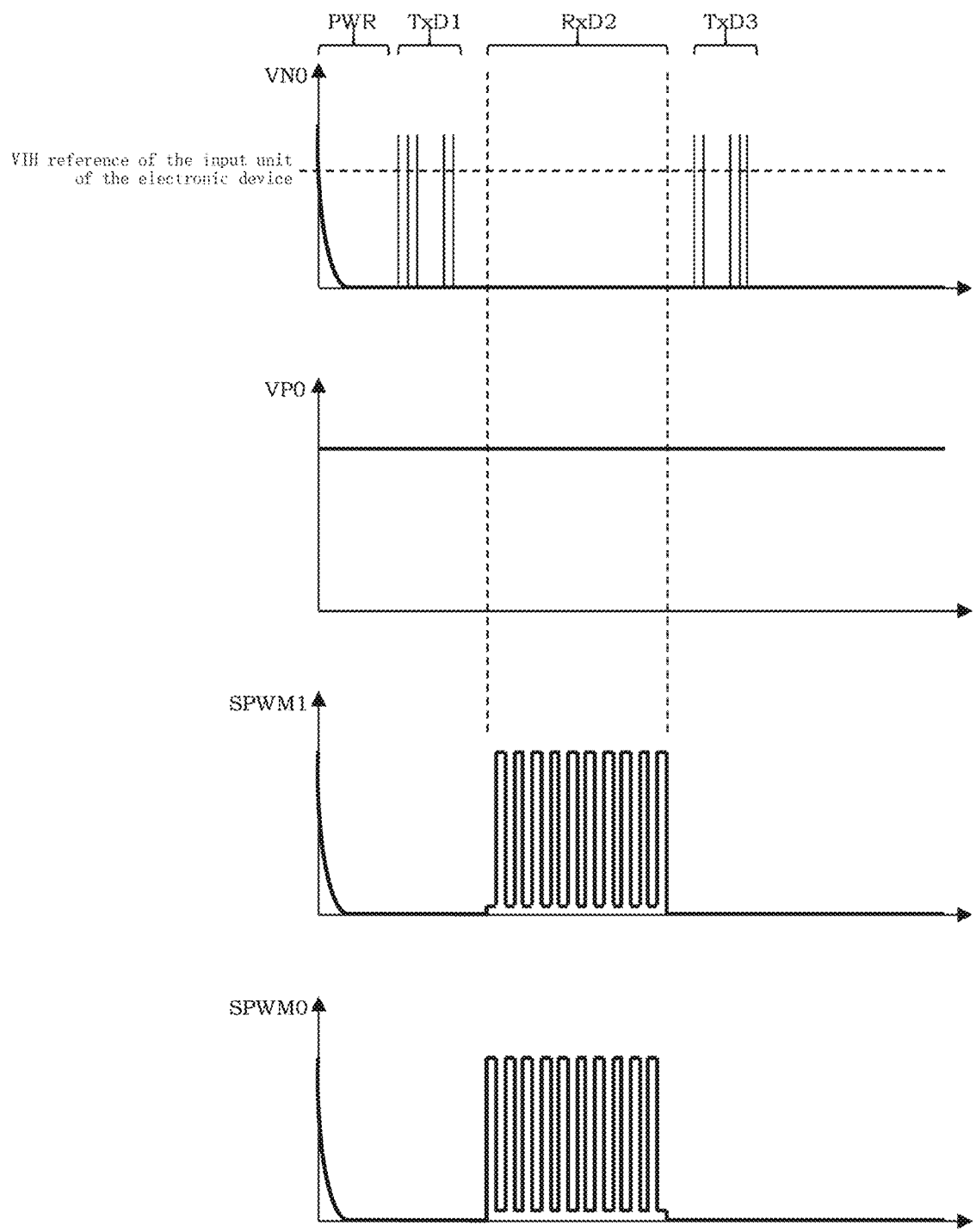
FIG. 16 is a signal oscillogram schematic diagram corresponding to the facilitating debugging system as described in the embodiment 2B of the present disclosure.

The schematic diagram of waveform corresponding to the present embodiment is shown in FIG. 16.

Figure 17:
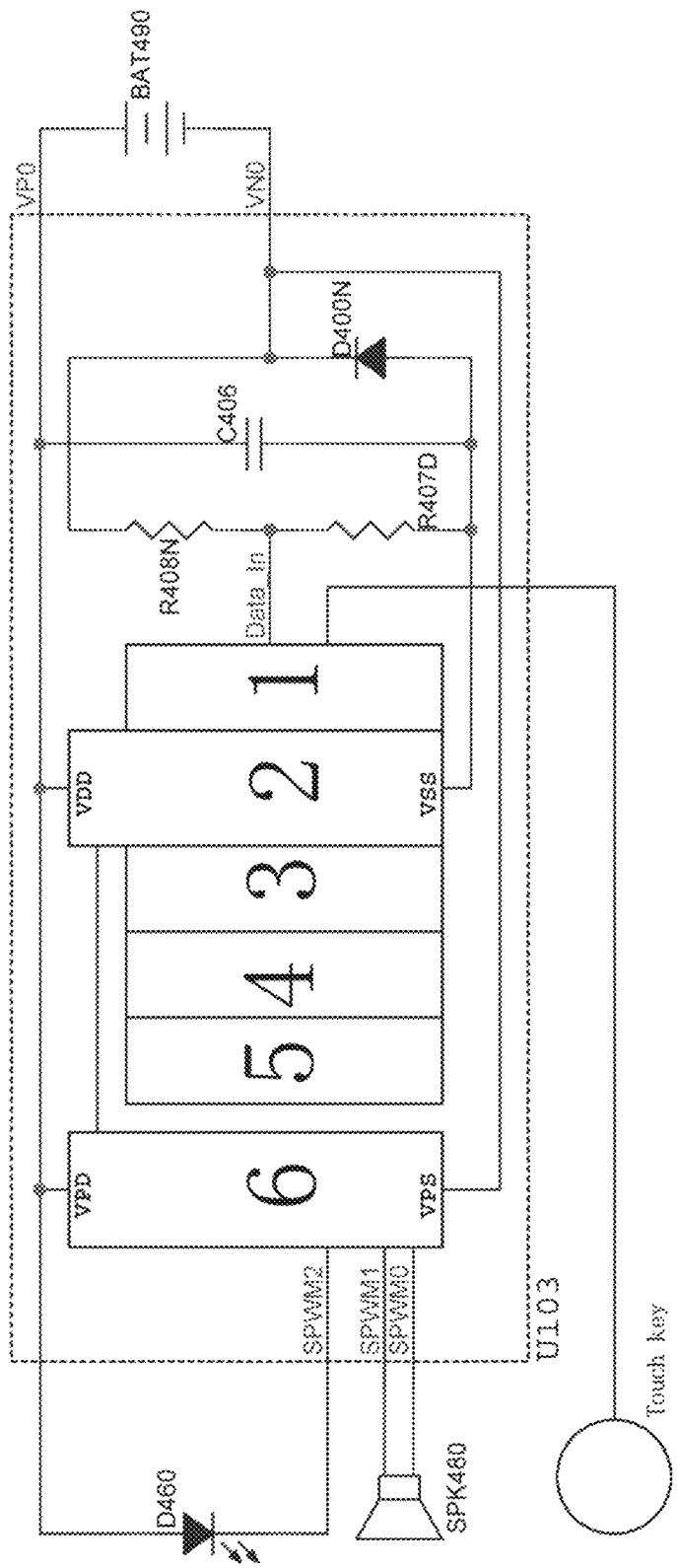
FIG. 17 is a schematic diagram of the electronic device with independent power-on as described in the embodiment 2B of the present disclosure.

As shown in FIG. 17, after the operation of the electronic device is completed, the master device can be removed, the electronic device works independently after power-on.

After separation from the testing device and the master device, the electronic device works independently after power-on, VPN0 and VNP0 are connected to power-supply BAT490.

Embodiment 2C

A debugging system for electronic devices includes a master device and an electronic device. The rectifying unit includes a negative half-wave rectifying circuit and the action signal output circuit is a LED, the electronic device has a built-in rechargeable battery or capacitor.

Figure 18A:
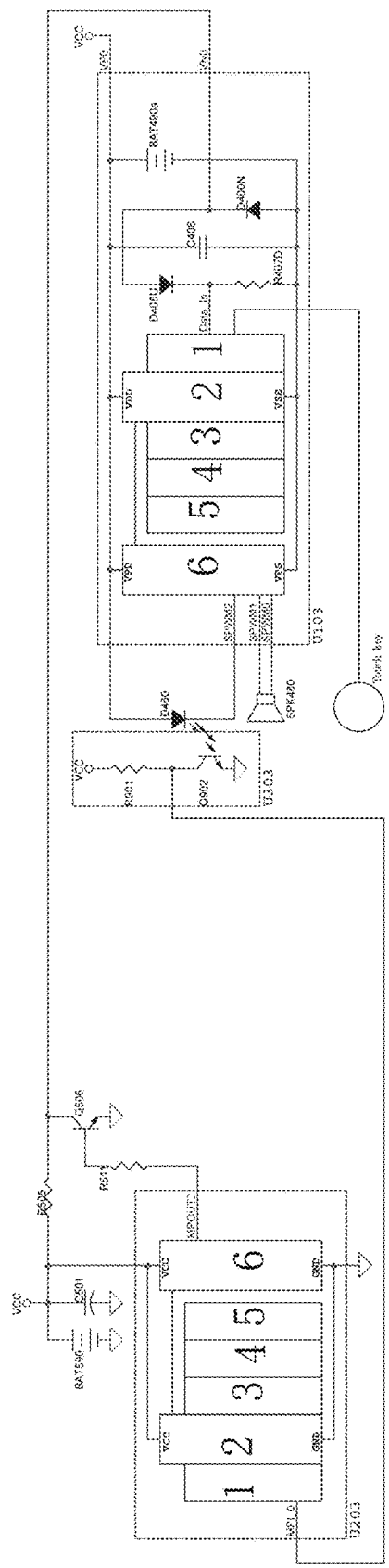
FIG. 18a is a schematic diagram of the facilitating debugging system as described in the embodiment 2C of the present disclosure.

As shown in FIG. 18a, the difference between the present embodiment and embodiment 2A is: the electronic device has a built-in rechargeable battery or capacitor.

Figure 18B:
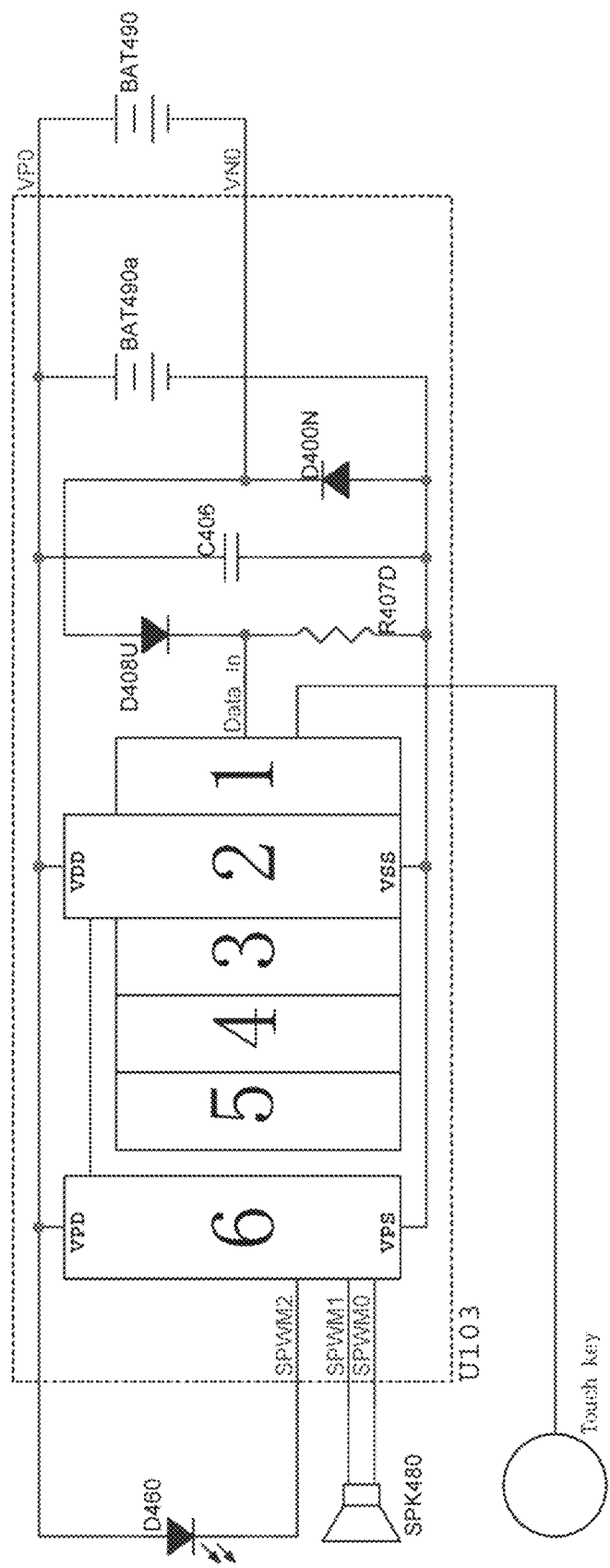
FIG. 18b is a schematic diagram of the electronic device with independent power-on as described in the embodiment 2C of the present disclosure.

As shown in FIG. 18b, the electronic device has a built-in rechargeable battery or capacitor BAT490a, after the operation of the electronic device is completed, the master device can be removed, the electronic device works independently by utilizing the built-in rechargeable battery or capacitor, or connects the positive input end VP0 and negative input end VN0 of the electronic device to the external power-supply BAT490.

Embodiment 2D

A debugging system for electronic devices includes a master device and an electronic device. The rectifying unit includes a full-wave rectifying circuit and the action signal output circuit is a LED, the electronic device has a built-in battery.

Figure 19A:
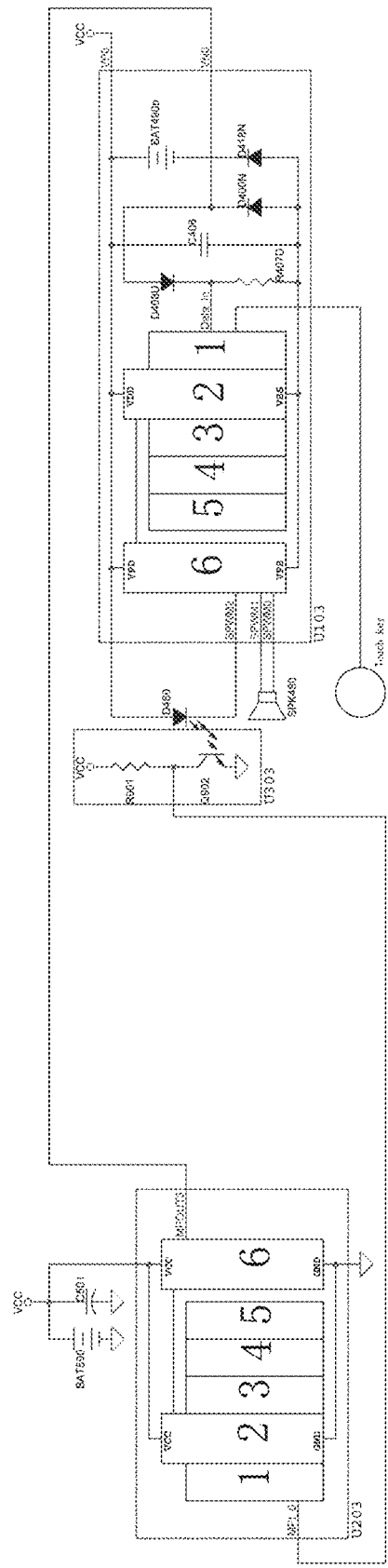
FIG. 19a is a schematic diagram of the facilitating debugging system as described in the embodiment 2D of the present disclosure.

As shown in FIG. 19a, the difference between the present embodiment and embodiment 2A is: the electronic device has a built-in battery.

The output circuit MPOUT3 of the master device utilizes GPIO (General Purpose Input/Output) to push the negative input end of the electronic device directly.

Figure 19B:
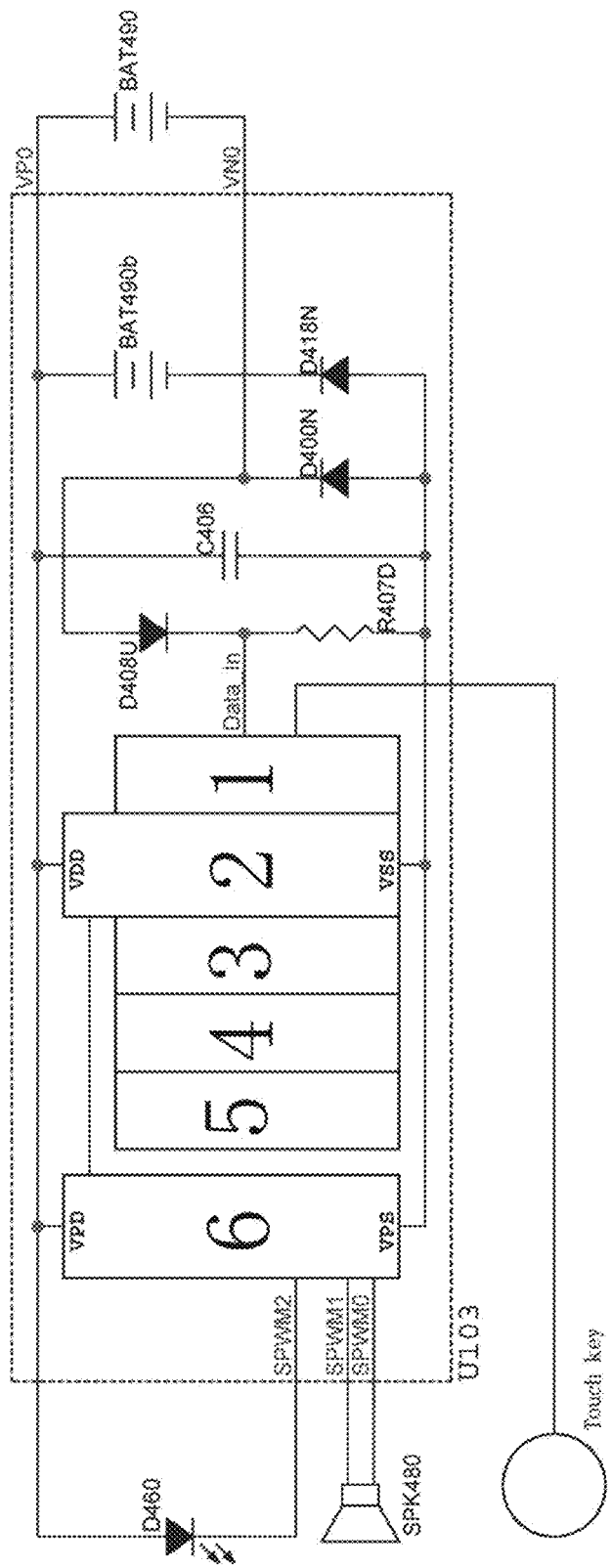
FIG. 19b is a schematic diagram of the electronic device with independent power-on as described in the embodiment 2D of the present disclosure.

As shown in FIG. 19b, the electronic device has a built-in battery BAT490b, after the operation of the electronic device is completed, the master device can be removed, the electronic device works independently by utilizing the built-in battery BAT490b, or connects the positive input end VP0 and negative input end VN0 of the electronic device to the external power-supply BAT490.

Embodiment 3A

A debugging system for electronic device includes a master device and an electronic device. The rectifying unit includes a full-wave rectifying circuit, and the action signal output circuit is a LED.

Figure 20:
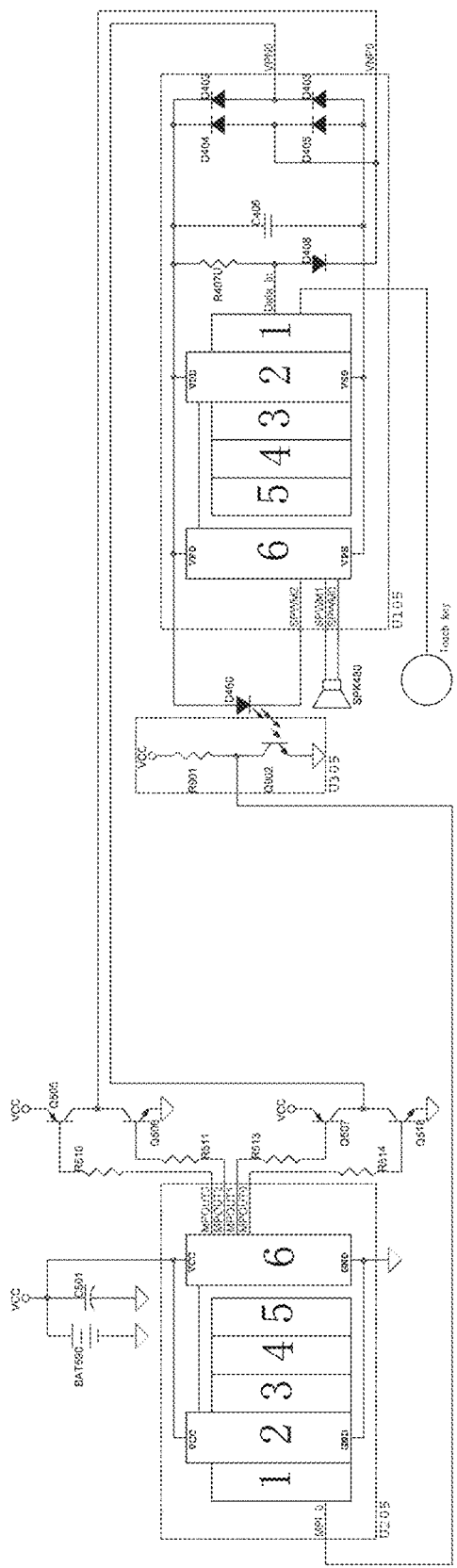
FIG. 20 is a schematic diagram of the facilitating debugging system as described in the embodiment 3A of the present disclosure.
Figure 21:
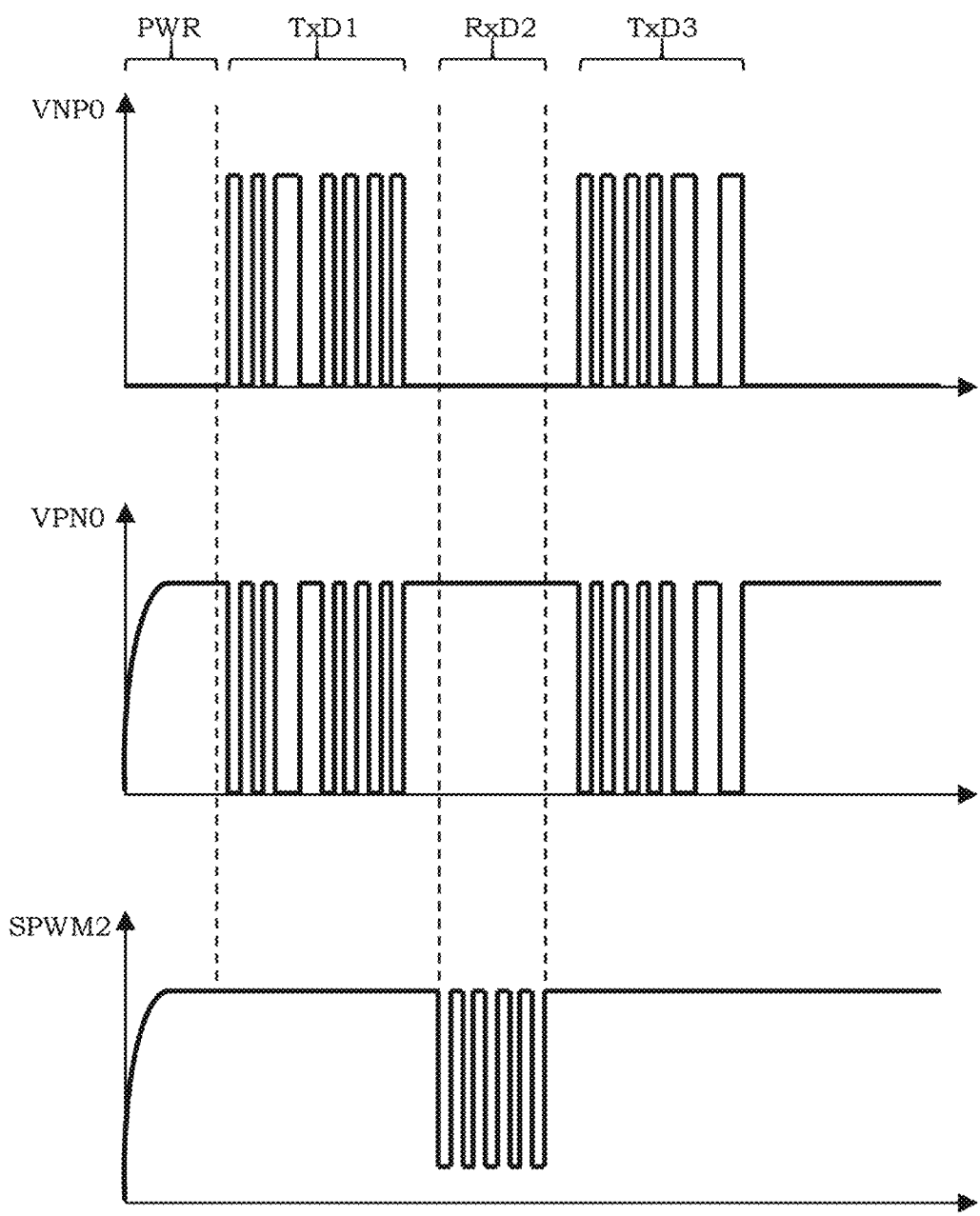
FIG. 21 is a signal oscillogram of the electronic device parameter debugging process as described in embodiment 3A of the present disclosure.

The schematic diagram of the present embodiment is shown in FIG. 20. The master device includes the master processing circuit U205 and a testing device U305, and the electronic device includes the signal processing circuit U105. The difference between the present embodiment and the embodiment 1A is that the rectifying unit includes a full-wave rectifying circuit, and the parameter debugging waveform corresponding to the present embodiment is shown in FIG. 21. FIG. 21 includes signal waveforms of the power input end VNP0/VPN0 of the electronic device and the output end SPWM2 of the output circuit of the electronic device. The working processes of PWR, TxD1, RxD2, and TxD3 are similar to the adjustment working process of Embodiment 1A, and the details are not described herein.

Figure 22:
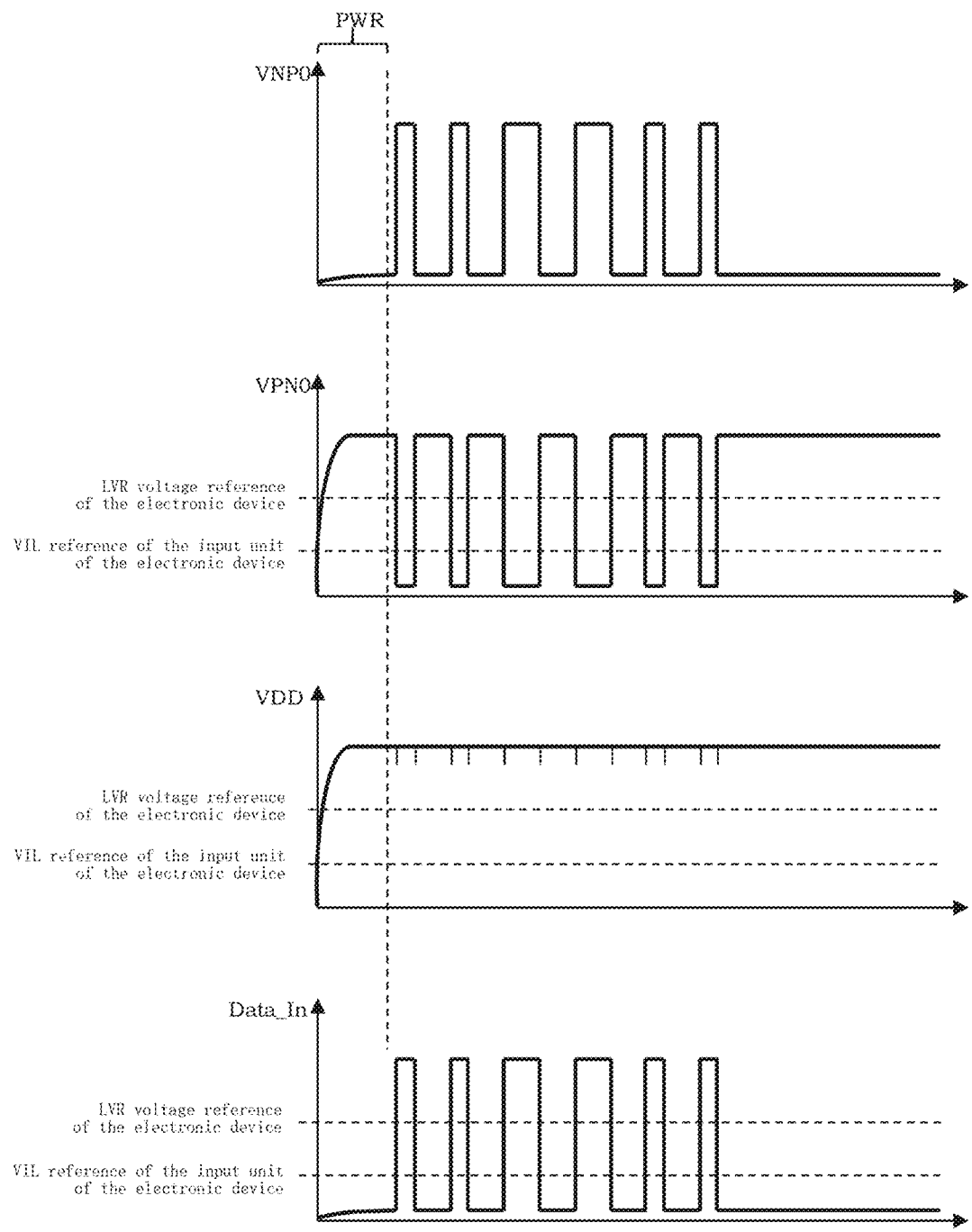
FIG. 22 is an oscillogram of the electronic device working principle of the facilitating debugging system as described in the embodiment 3A of the present disclosure.

The schematic diagram of the full-wave rectifying electronic device is shown in FIG. 22. The output circuit of the master device inputs a high electric potential to the positive input end VPN0, and a low electric potential to the negative input end VNP0 of the power-supply interface of the electronic device, and the power-supply interface VPN0/VNP0 charges the capacitor C406 through the full-wave bridge rectifying circuit which is composed of diode D402, D403, D404, D405. When the stored electric potential in capacitor C406 is essentially equal to the electric potential of power-supply interface VPN0/VNP0, and the potential of the input end Data_In of the input circuit of the electronic device is pulled up by the pull-up resistor R407U of the input circuit of the electric device above the VIH (Input High Voltage) reference or is pulled down to the VIL (Input low Voltage) reference by the serial-connected diode D408 to enable the effective high electric potential input signal may be identified by the logic operation circuit of the electronic device, after the above state is stable for a short period of time, and then complete the PWR (Power On Reset) period of the electronic device.

The output circuit of the master device performs a mutual transition of electric potential to the power-supply interface VPN0/VNP0 of the electronic device, during a short gap of the transition, the power-supply VDD/VSS of the electronic device is powered by the electric energy stored by the capacitor C406, and the electric potential of power-supply interface VPN0/VNP0 is recharged by the full-wave bridge rectifying circuit through the capacitor C406 after the transition.

If the power-supply interface VNP0 is in the low electric potential, the input end Data_In of the electronic device input circuit is pulled down by serial-connected diode D408.

When the electric potential outputted to the input end Data_In of the electronic device input circuit is lower than the VIL (Input low Voltage) reference of electronic device input circuit, the effective low electric potential input signal is identified by the logic operation circuit.

If the power-supply interface VNP0 is in the high electric potential, the input end Data_In of the electronic device input circuit is pulled up by the pull-up resistor R407U. When the electric potential outputted to the input end Data_In of the electronic device input circuit is higher than the VIH (Input High Voltage) reference of electronic device input circuit, the effective high electric potential input signal is identified by the logic operation circuit.

Matching with suitable access signals (for example, Manchester coding signals), the full-wave rectifying electronic device obtains the advantage that the power-supply pins are not polarized.

Embodiment 3B

A debugging system for electronic device includes a master device and an electronic device, the rectifying unit includes a full-wave rectifying circuit, and the action signal output circuit is a speaker.

Figure 23A:
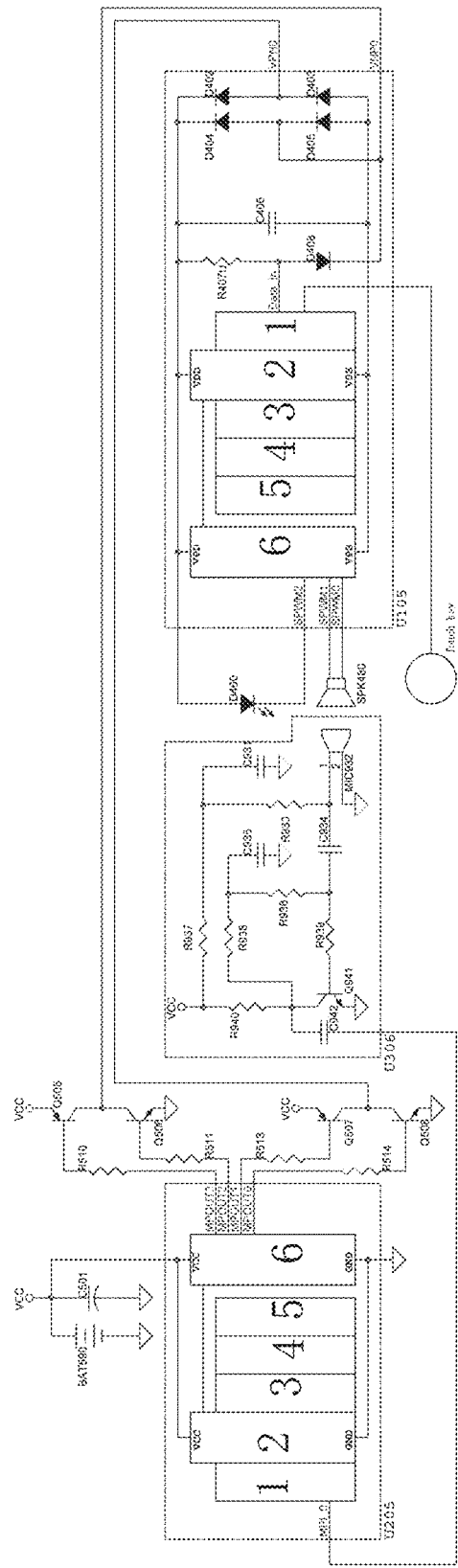
FIG. 23a is a schematic diagram of the facilitating debugging system as described in the embodiment 3B of the present disclosure.

As shown in FIG. 23a, the difference between the present embodiment and embodiment 3A: the action signal output circuit of the electronic device is changed from LED (marked as D460) to speaker SPK480, and the sensing element on the testing device is microphone MIC932.

Figure 24:
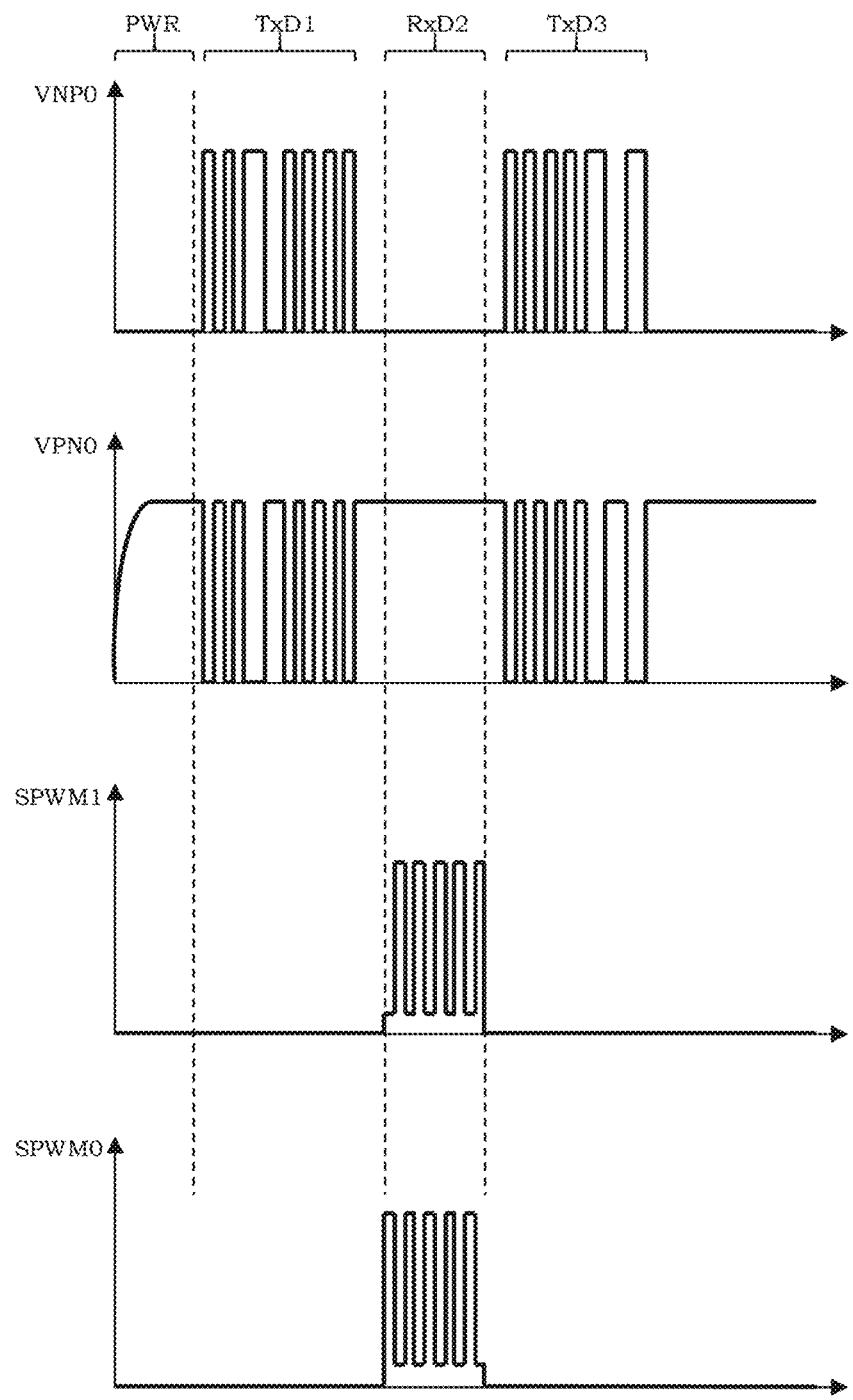
FIG. 24 is a signal oscillogram schematic diagram corresponding to the facilitating debugging system as described in the embodiment 3B of the present disclosure.

A waveform diagram corresponding to the present embodiment is shown in FIG. 24.

Figure 23B:
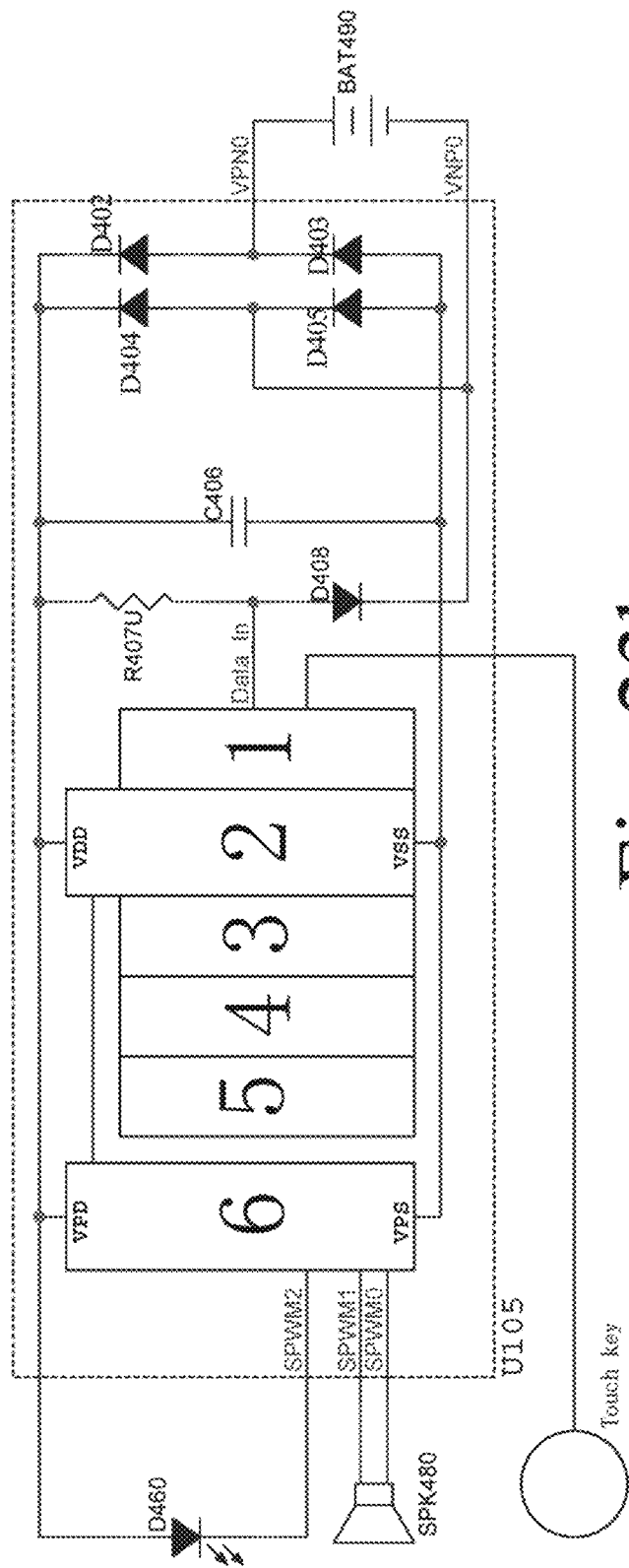
FIG. 23b is a schematic diagram of the electronic device with independent power-on as described in the embodiment 3B of the present disclosure.

As shown in FIG. 23b, after the operation of the electronic device is completed, the master device can be removed, the electronic device works independently after power-on.

After separation from the testing device and the master device, the electronic device works independently after power-on, VPN0 and VNP0 are connected to power-supply BAT490.

Embodiment 3C

A debugging system for electronic devices includes a master device and an electronic device. The rectifying unit includes a full-wave rectifying circuit and the action signal output circuit is a LED, the electronic device has a built-in rechargeable battery or capacitor.

Figure 25A:
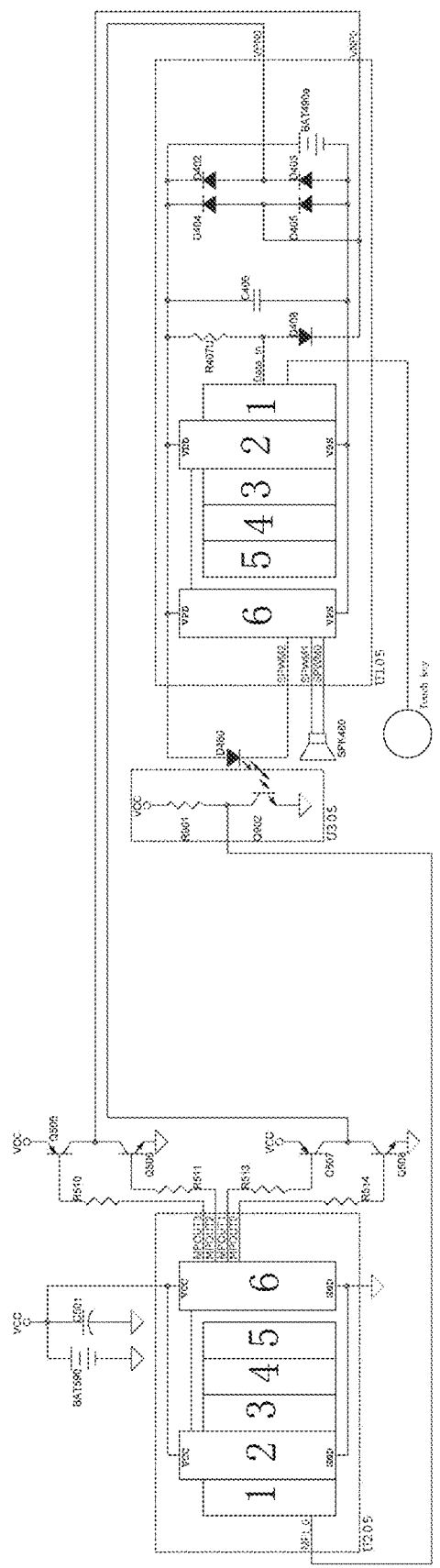
FIG. 25a is a schematic diagram of the facilitating debugging system as described in the embodiment 3C of the present disclosure.

As shown in FIG. 25a, the difference between the present embodiment and embodiment 3A is: the electronic device has a built-in rechargeable battery or capacitor.

Figure 25B:
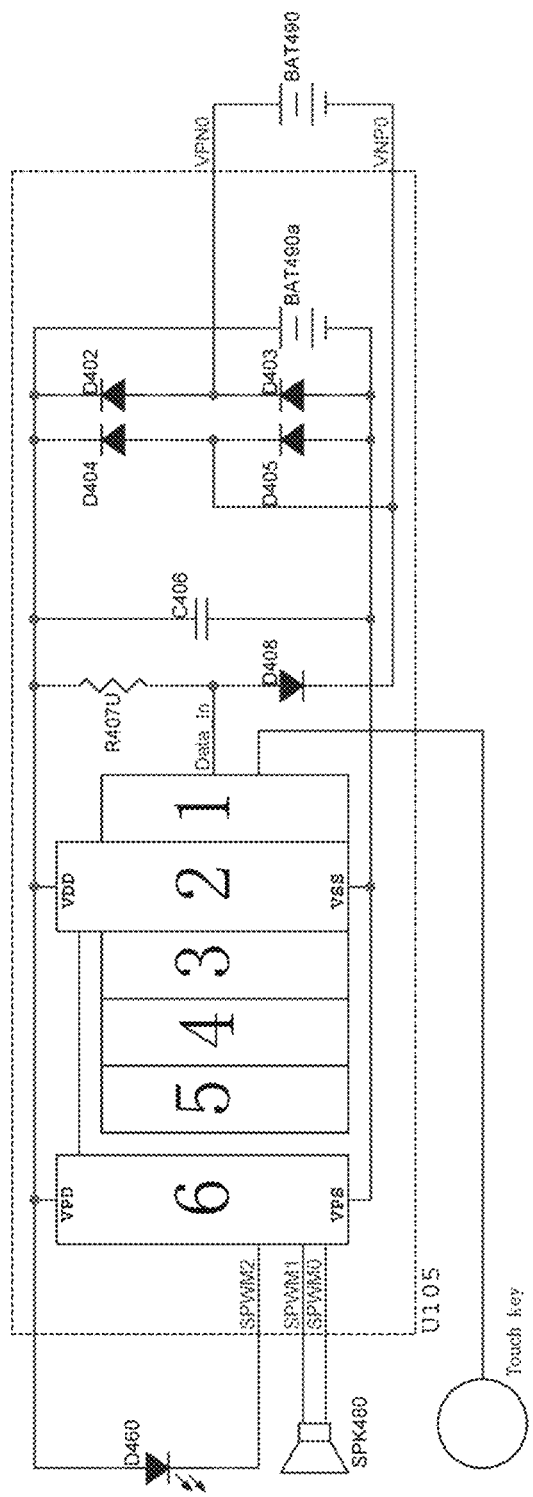
FIG. 25b is a schematic diagram of the electronic device with independent power-on as described in the embodiment 3C of the present disclosure.

As shown in FIG. 25b, in the present embodiment, the electronic device has a built-in rechargeable battery or capacitor BAT490a, after the operation of the electronic device is completed, the master device can be removed, the electronic device works independently by utilizing the built-in rechargeable battery or capacitor, or connects the power-supply interface VPN0/VNP0 of the electronic device to the external power-supply BAT490.

Embodiment 3D

A debugging system for electronic devices includes a master device and an electronic device. The rectifying unit includes a full-wave rectifying circuit and the action signal output circuit is a LED, the electronic device has a built-in battery.

Figure 26A:
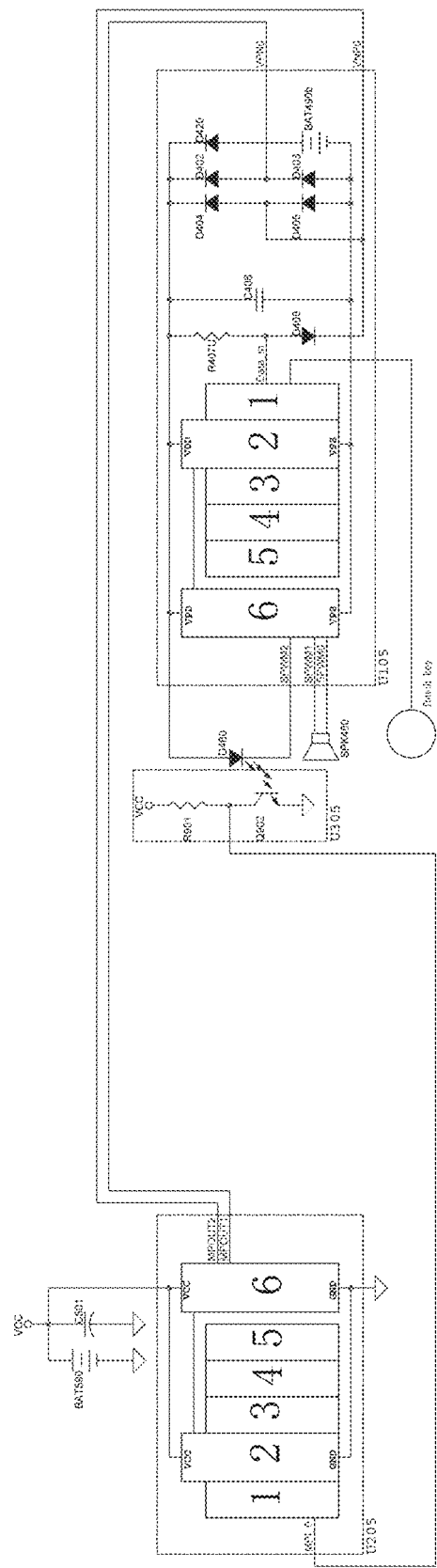
FIG. 26a is a schematic diagram of the facilitating debugging system as described in the embodiment 3D of the present disclosure.

As shown in FIG. 26a, the difference between the present embodiment and embodiment 3A is: the electronic device has a built-in battery. The output end MPOUT1/MPOUT2 of the master device output circuit utilize PWM/Push-Pull to push the power-supply interface VPN0/VNP0 directly.

Figure 26B:
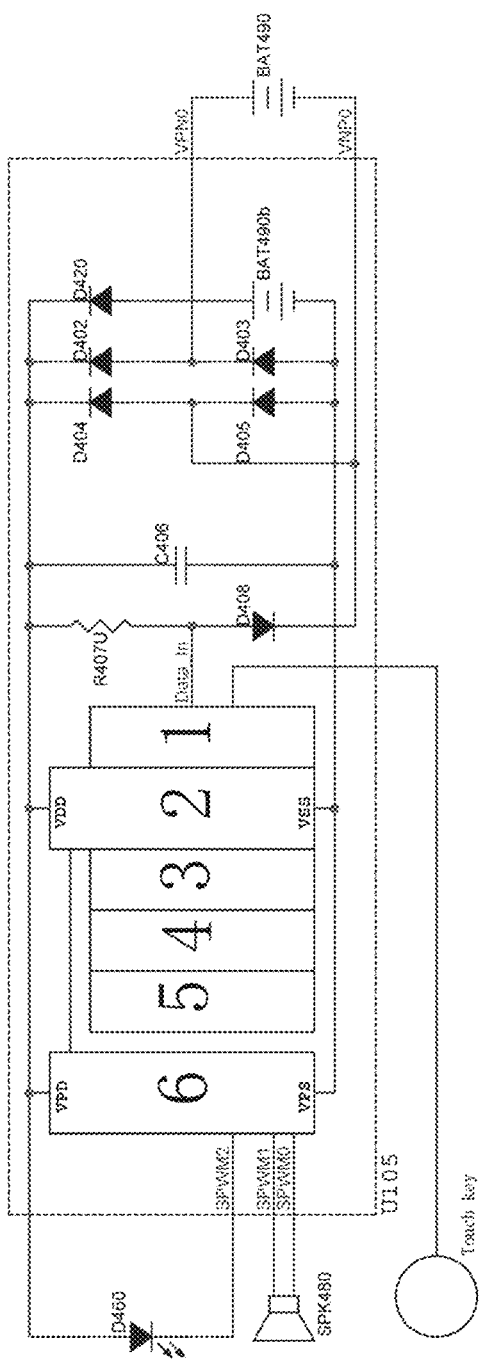
FIG. 26b is a schematic diagram of the electronic device with independent power-on as described in the embodiment 3D of the present disclosure.

As shown in FIG. 26b, the electronic device has a built-in battery BAT490b, after the operation of the electronic device is completed, the master device can be removed, the electronic device works independently by utilizing the built-in battery BAT490b, or connects the power-supply interface VPN0/VNP0 of the electronic device to the external power-supply BAT490.

Embodiment 4A

Figure 27:
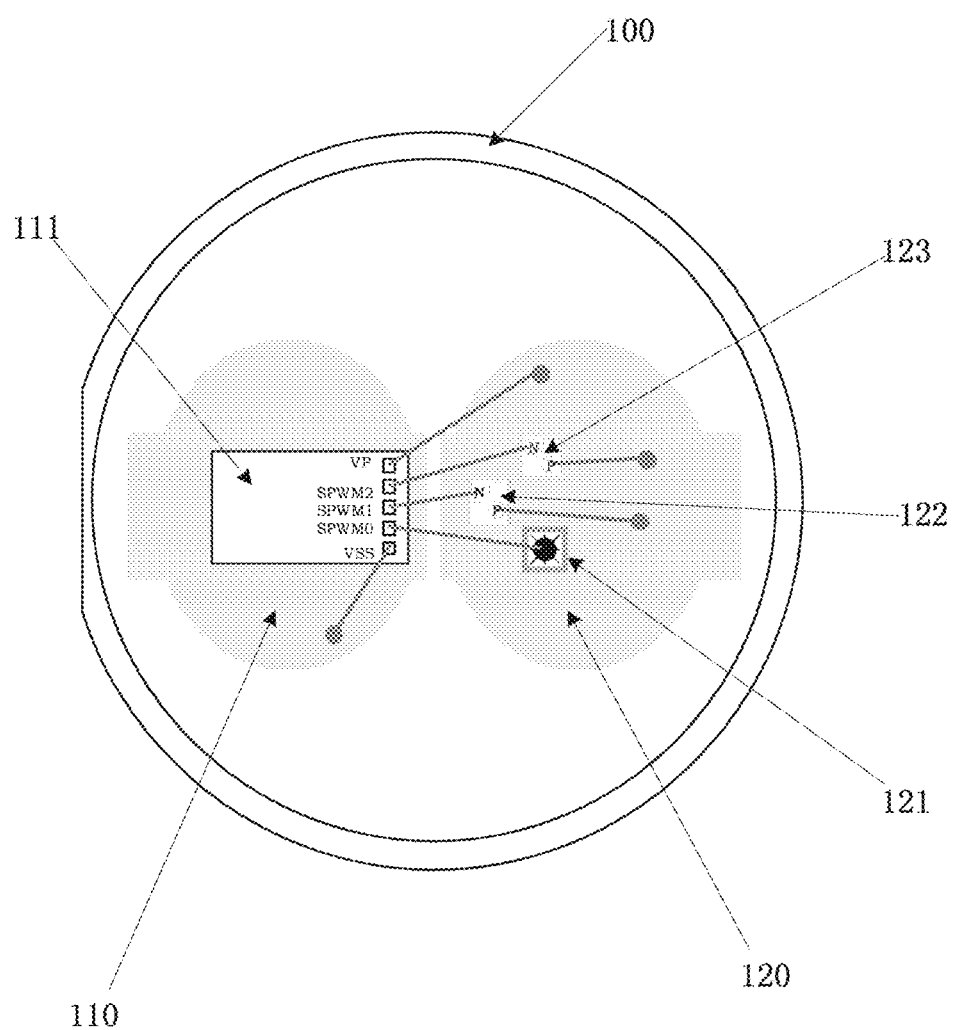
FIG. 27 is a perspective view from the top of the electronic device as described in the embodiment 4A of the present disclosure.
Figure 28:
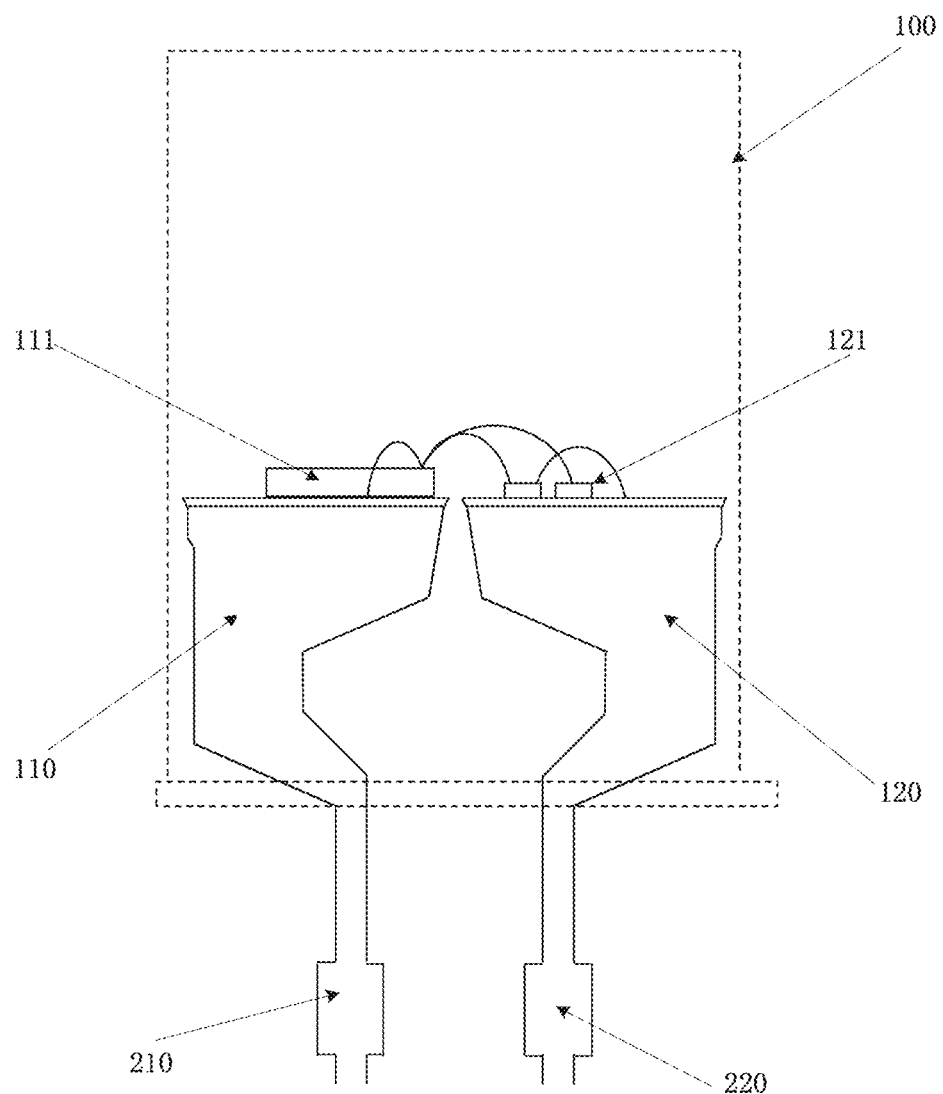
FIG. 28 is a perspective view from the side of the electronic device as described in the embodiment 4A of the present disclosure.

In the present embodiment, the electronic device is DIP in-line LED bead and has a structure shown as FIG. 27 and FIG. 28. In FIG. 28, the DIP in-line LED bead includes a housing 100, a negative electrode support 110, a positive electrode support 120, a single-electrode LED 121, a dual-electrodes LED 122, a dual-electrodes LED 123, an integrated IC chip of signal processing circuit 111, a negative electrode pin 210, a positive electrode pin 220. Further, the negative electrode support 110 and the negative electrode pin 210 are designed to be integrated and electrically connected; and the positive electrode support 120 and the positive electrode pin 220 are designed to be integrated and electrically connected. The positive electrode end VP of the signal processing circuit integrated IC chip 111 is electrically connected to the positive electrode support 120, and the negative electrode end VSS of the signal processing circuit integrated IC chip 111 is electrically connected to the negative electrode support 110. The negative electrode end of the single-electrode LED 121 is electrically connected to the output end SPWM0 of the signal processing circuit integrated IC chip 111, and the positive electrode of the single-electrode LED 121 is electrically connected to the positive electrode support 120 by affixing conducting resin at the bottom layer of single-electrode LED 121. The negative electrode end N of the dual-electrodes LED 122 is electrically connected to the output end SPWM1 of the signal processing circuit integrated IC chip 111, and the positive electrode end P of the dual-electrodes LED 122 is connected to the positive electrode support 120; and the negative electrode end N of the dual-electrodes LED 123 is electrically connected to the output end SPWM2 of the signal processing circuit integrated IC chip 111, the positive electrode end P of the dual-electrodes LED 123 is electrically connected to the positive electrode support 120.

Figure 29:
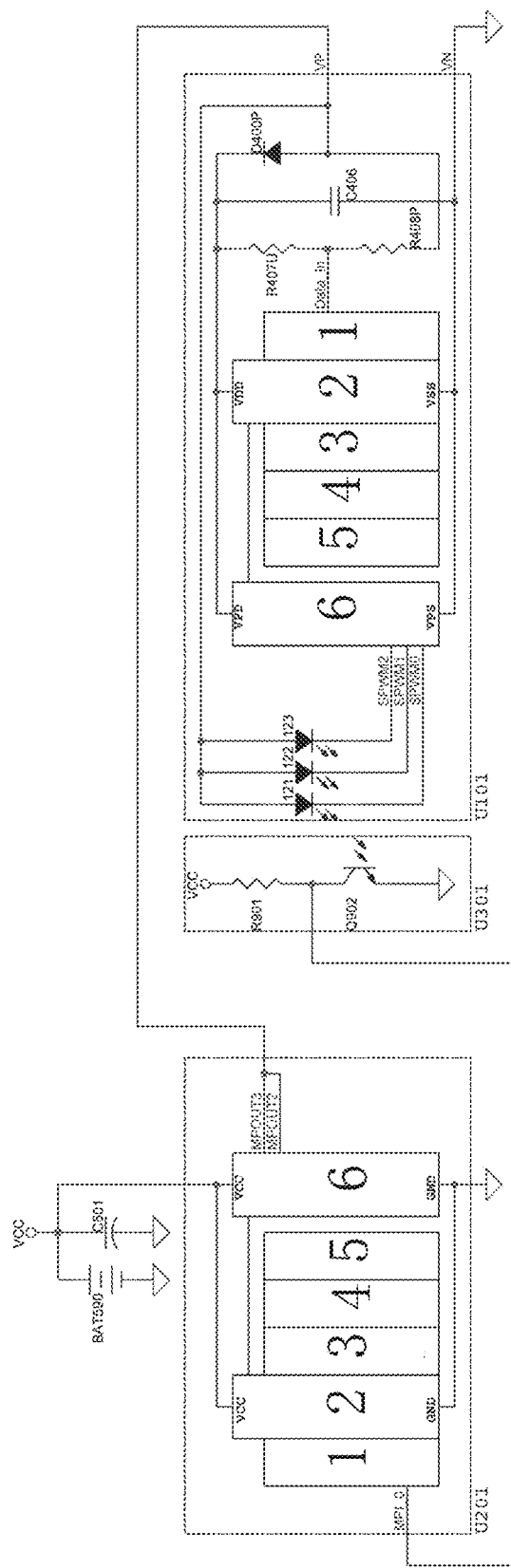
FIG. 29 is a schematic diagram of the corresponding debugging system as described in the embodiment 4A of the present disclosure.

The schematic diagram of the debugging system corresponding to the present embodiment is shown in FIG. 29, which includes the master processing circuit U201, the testing device U301, and a positive half-wave rectifying electronic device U101. The working principle of this embodiment is similar to that of Embodiment 1A, and the details are not described herein.

In the present embodiment, the LED bead includes a housing and a power-supply interface which extends to exterior of the housing; and the power-supply interface includes negative electrode pin and positive electrode pin, and interior of the housing is provided with negative electrode support and positive electrode support, and the negative electrode support is provided with signal processing circuit, and the positive electrode support is provided with LED which serves as the action signal output circuit. The signal processing circuit adopts an integrated IC chip to realize its function.

In principle, LED may be driven in two ways: Drive/Sink, and both of the method are suitable for the present embodiment. However, considering the convenience that the DIP in-line LED bead may bring to its packaging, gathering LEDs on the positive electrode support 120 would perform a better light-mixing effect, and the signal processing circuit IC chip is placed on the negative electrode support 110, and placement would be arranged properly as shown in FIG. 23 and FIG. 24. Considering that some LED bead supports are only provided with a large support for placement of the chip, LED and the signal processing circuit IC chip are placed on the large support.

Embodiment 4B

Figure 30:
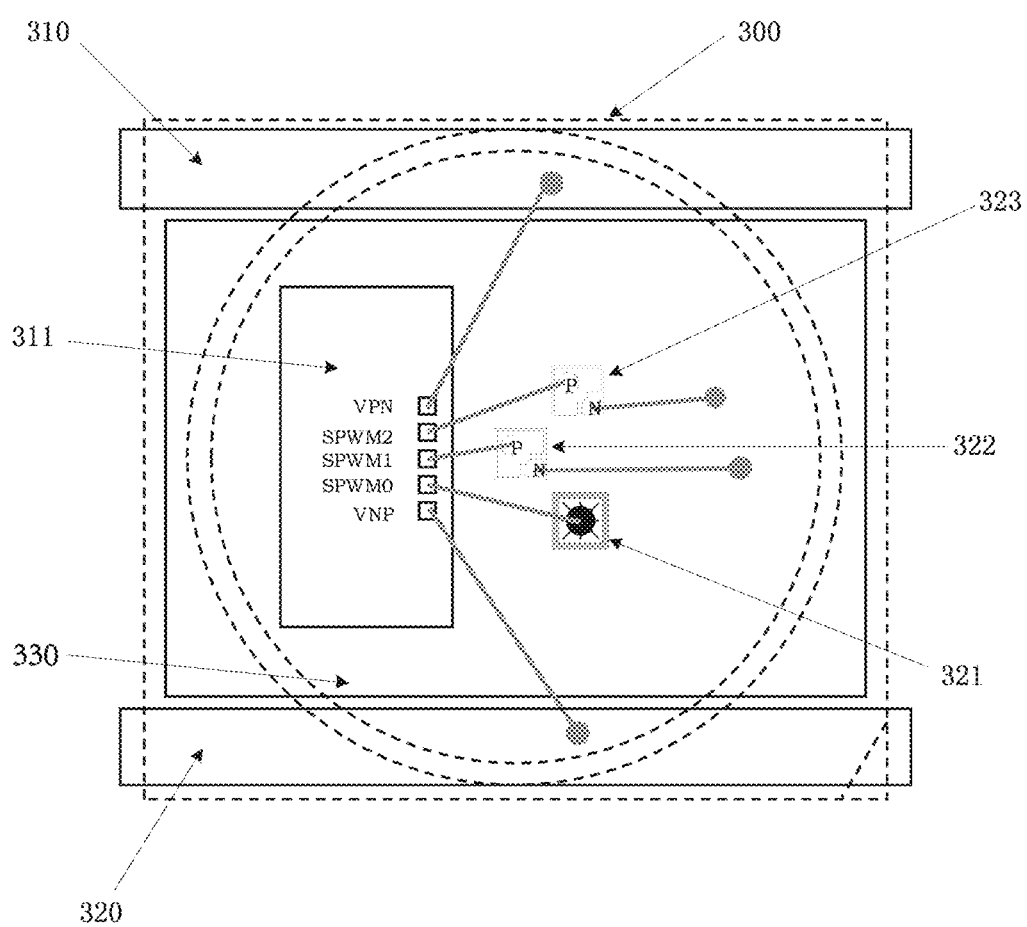
FIG. 30 is a perspective view from the top of the electronic device as described in the embodiment 4B of the present disclosure.

In the present embodiment, the electronic device may be the SMD LED bead with a structure shown as FIG. 30. In FIG. 30, the SMD LED bead includes a housing 300, a power-supply pin 310/320, ground reference 330, a single-electrode LED 321, a dual-electrodes LED 322, a dual-electrodes LED 323, a signal processing circuit integrated IC chip 311. The power-supply interface VPN/VNP of the signal processing circuit integrated IC chip 311 is electrically connected to the power-supply pin 310/320 respectively. Positive electrode end of the single-electrode LED 321 is electrically connected to the output end SPWM0 of the signal processing circuit integrated IC chip 311, and the negative electrode end of the single-electrode LED 321 is electrically connected to the ground reference 330 by conductive resin affixed at the bottom layer the positive electrode P of the dual-electrodes LED 322 is electrically connected to the output end SPWM1 of the signal processing circuit integrated IC chip 311, the negative electrode N of the dual-electrodes LED 322 is electrically connected to the ground reference 330; the positive electrode P of the dual-electrodes LED 323 is electrically connected to the output end SPWM2 of the signal processing circuit integrated IC chip 311, the negative electrode N of the dual-electrodes LED 323 is electrically connected to the ground reference 330.

Figure 31:
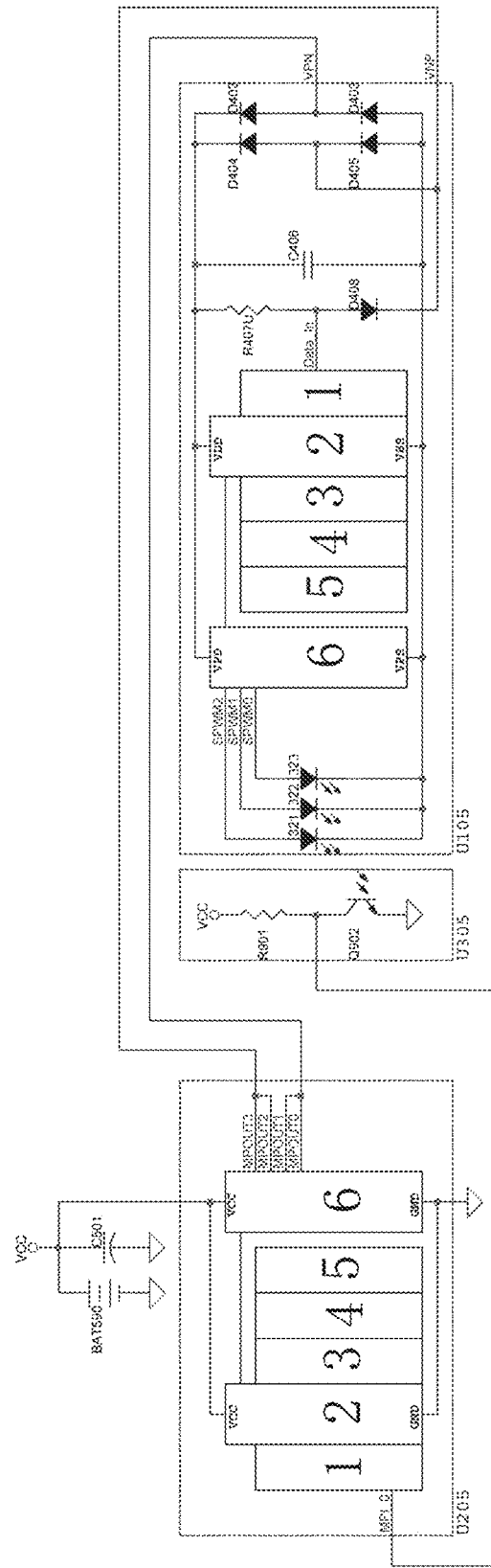
FIG. 31 is a schematic diagram of the corresponding debugging system as described in the embodiment 4B of the present disclosure.

The schematic diagram of the debugging system corresponding to the present embodiment is shown in FIG. 31, which includes the master processing circuit U205, the testing device U305, and a full-wave rectifying electronic device U105. The working principle of this embodiment is similar to that of Embodiment 3A, and the details are not described herein.

Embodiment 5A

A debugging system for electronic device includes a master device and a plurality of electronic devices, and the electronic devices are LED beads.

In the present embodiment, the debugging system includes a plurality of electronic devices which connected successively in series or in parallel, and correspondingly, the master device includes a plurality of testing devices, each of which is used to detect the action signal outputted by the action signal output circuit of each electronic device, and the output end of each of the plurality of testing devices is connected to the input end of the master processing circuit.

In the present embodiment, a plurality of LED beads are connected in series or in parallel to form a light string. Since each LED bead can be independently controlled and operated, the LED light string with individual control or point control can be conveniently realized, and the synchronous blink or bounce blink or scanner blink can also be conveniently realized, and so as the function of the other types of LEDs light strings.

When a plurality of electronic devices are connected in series, a voltage stabilizing diode needs to be parallel-connected in reverse at the power-supply interface or between the positive end and negative end of the output end of the rectifying unit of each electronic device. In the signal debugging phase, the master device can output an AC signal to drive a plurality of serial-connected electronic devices; in the independent operation phase, a plurality of serial-connected electronic devices can be operated by the external AC signal.

The advantages achieved by the present disclosure includes but are not limited to:

1. Very few external interfaces for electronic devices:

(1) few PACKAGE (package sheet)/PCBA/COB connection joints or solder joints, reducing production costs, and also facilitating the miniaturization of PACKAGE (SMD)/PCBA/COB.

(2) It is beneficial to the waterproof, dustproof and beautiful design of the housing of the electronic products (electronic devices). Except for the original power supply interface, no additional test interfaces, programming interfaces and correcting interfaces are required.

(3) It is convenient for updating, testing and debugging the program information after the assembly of the product (electronic device) is completed, and it is also convenient for the user to complete the updating of the customized or real-time information, thereby facilitating the sales of the customized product.

2. The testing, voltage and frequency parameter correcting, high-speed transmission, controlling, and burning requirements are satisfied during mass production of the semi-finished PACKAGE (SMD)/PCBA/COB module, and other electronic devices.

3. The product (electronic device) can adjust the internal oscillation frequency of the signal processing circuit (for example, correcting the offset of the internal oscillation frequency of the IC semiconductor caused by the influence of the packaging material). When collaborating with passive components with a large error range during mass production, the products (electronic devices) may have better consistency, the quality and the efficiency of burning and updating the information of the products (electronic device) can be improved.

The above is a detailed description of the preferred embodiments of the present disclosure, but the present disclosure is not limited to the embodiments, and various equivalent modifications may be made by those skilled in the art without departing from the spirit of the disclosure. Such equivalent modifications or substitutions are intended to be included within the scope of the appended claims.

The invention claimed is:

1. A facilitating debugging electronic device, comprising:
a power-supply interface;
a signal processing circuit configured for receiving and processing an access signal received from the power-supply interface, and driving an action signal output circuit to output a corresponding action signal according to the access signal, wherein an input end of the signal processing circuit is connected to an output end of the power-supply interface;
wherein the action signal output circuit connected to an output end of the signal processing circuit, for outputting a detectable action signal;
wherein the signal processing circuit comprises a rectifying unit, an input circuit, a logic operation circuit and an output circuit; and the access signal is successively transmitted through the rectifying unit, the input circuit, logic operation circuit and the output circuit, and is outputted to the action signal output circuit;
wherein the rectifying unit comprises:
a positive half-wave/negative half-wave/full-wave rectifying circuit;
a capacitor in parallel with an output end of the positive half-wave/negative half-wave/full-wave rectifying circuit; and
a voltage division circuit connected between an input end and output end of the rectifying unit;
wherein the voltage division circuit comprises a pull-up/pull-down resistor and a series resistor/diode connected in series thereto, the pull-up/pull-down resistor and the series resistor/diode output signals to the input circuit after voltage division.

2. The electronic device of claim 1, wherein the signal processing circuit further comprises a storage circuit connected to the logic operation circuit.

3. The electronic device of claim 1, further comprising a frequency/reference voltage regulating unit for regulating the clock vibrating frequency and reference voltage of the electronic device.

4. The electronic device of claim 1, further comprising a reset unit, which is used to controlling the reset and restart of the electronic device.

5. The electronic device of claim 4, wherein the output circuit is PWM output circuit.

6. The electronic device of claim 1, wherein the action signal output circuit is an action signal output circuit of light wave, electromagnetic wave, sound wave/ultrasonic wave or mechanical vibration wave, and correspondingly, the action signal is a signal of light wave, electromagnetic wave, sound wave/ultrasonic wave or mechanical vibration wave.

7. The electronic device of claim 6, wherein the electronic device is LED light, LDO, LVD, charging management IC, wireless RF module, voice IC, microcomputer MCU, memory, sensor, servo, servo motor, wearable electronic device, handheld smart electronic device, electronic measuring device or electronic toy.

8. The electronic device of claim 7, wherein the electronic device is a LED light bead, and the LED light bead comprises a housing and the power-supply interface which extends to exterior of the housing, and the power-supply interface comprises a negative electrode pin and a positive electrode pin, and a negative electrode support and a positive electrode support is provided in an interior of the housing, and the negative electrode support is provided with the signal processing circuit, and the positive electrode support is provided with the LED serving as the action signal output circuit.

9. A system for debugging electronic device, comprising:
a facilitating debugging electronic device, comprising:
a power-supply interface;
a signal processing circuit configured for receiving and processing an access signal received from the power-supply interface, and driving an action signal output circuit to output a corresponding action signal according to the access signal, wherein an input end of the signal processing circuit is connected to an output end of the power-supply interface;
wherein the action signal output circuit connected to an output end of the signal processing circuit, for outputting a detectable action signal; and
a master device comprising a master processing circuit and a testing device;
wherein the master processing circuit is configured for outputting the access signal to the power-supply interface of the electronic device, the testing device comprises a sensing element configured correspondingly to the action signal output circuit of the electronic device, the testing device is configured to detect the detectable action signal outputted by the action signal output circuit of the electronic device, and convert the action signal into electric signal for transmitting back to the master processing circuit.

10. The system of claim 9, wherein the master processing circuit comprises an input circuit, a logic operation circuit and an output circuit; the input circuit is connected to the logic operation circuit, the logic operation circuit is connected to the output circuit, the output circuit is configured for outputting the access signal to the power-supply interface of the electronic device, the input circuit is configured for receiving the electric signal transmitted back from the testing device.

11. The system of claim 10, wherein the master device further comprises a driving circuit, the output circuit outputs the access signal to the power-supply interface of the electronic device through the driving circuit.

12. The system of claim 11, wherein the driving circuit is a voltage follower, which is configured for enhancing the output driving ability of the output circuit of the master device.

13. The system of claim 9, wherein the master processing circuit further comprises a storage circuit, a frequency/reference voltage regulating unit and a reset unit, the storage circuit is connected to the logic operation circuit, the frequency/reference voltage regulating unit is configured for regulating the clock vibrating frequency of the master device, the reset unit is configured for controlling the reset and restart of the master device.

14. The system of claim 13, wherein the action signal output circuit is an action signal output circuit of light wave, electromagnetic wave, sound wave/ultrasonic wave or mechanical vibration wave, and correspondingly, the sensing element is a sensing element of light wave, electromagnetic wave, sound wave/ultrasonic wave or mechanical vibration wave.

15. The system of claim 9, further comprising a plurality of electronic devices, which are successively connected in series/parallel, and correspondingly, the master device comprises a plurality of testing devices configured for detecting the detectable action signal outputted by the action signal output circuit of each electronic device, an output end of each testing device is connected to an input end of the master processing circuit.

16. The system of claim 15, the plurality of electronic devices are connected in series, the signal processing circuit comprises a rectifying unit, and a voltage stabilizing diode is parallel connected in reverse between the positive electrode and negative electrode of an output end of the rectifying unit or the power-supply interface of the electronic device.

17. A method for debugging electronic device, the method being applied in the system for debugging electronic device, wherein the system for debugging electronic device comprising:
a facilitating debugging electronic device, comprising:
a power-supply interface;
a signal processing circuit configured for receiving and processing an access signal received from the power-supply interface, and driving an action signal output circuit to output a corresponding action signal according to the access signal, wherein an input end of the signal processing circuit is connected to an output end of the power-supply interface;
wherein the action signal output circuit connected to an output end of the signal processing circuit, for outputting a detectable action signal; and
a master device comprising a master processing circuit and a testing device;
wherein the master processing circuit is configured for outputting the access signal to the power-supply interface of the electronic device, the testing device comprises a sensing element configured correspondingly to the action signal output circuit of the electronic device, the testing device is configured to detect the detectable action signal outputted by the action signal output circuit of the electronic device, and convert the action signal into electric signal for transmitting back to the master processing circuit;
the method comprising:
Step 1, outputting the access signal for debugging to the power-supply interface of the electronic device by the master device;
Step 2, receiving the access signal through the power-supply interface and driving the action signal output circuit to output the corresponding action signal according to the access signal, by the electronic device;
Step 3, detecting the detectable action signal outputted by the action signal output circuit of the electronic device by the testing device and then converting the action signal into an electric signal and transmitting back to the master processing circuit for processing, by the master device.

18. The method of claim 17, the Step 3 comprises sub-steps:
Step 31, detecting the detectable action signal outputted by the action signal output circuit of the electronic device by the testing device and then converting the action signal into the electric signal and transmitting back to the master processing circuit, by the master device;
Step 32, calculating signal parameters of the action signal outputted by the action signal output circuit of the electronic device by a logic operation circuit of the master processing circuit according to the electric signal acquired from step 31, wherein the signal parameters comprise a reference voltage, a frequency and a period corresponding to the action signal;
Step 33, comparing the signal parameters acquired from step 32 with a preset reference value and obtaining a deviation value, if the deviation value is within a preset range, move to Step 8, otherwise move to Step 4;
the method further comprises:
Step 4, modulating the access signal and transmitting the deviation value to the electronic device by the master device through an output circuit;
Step 5, writing the value into a storage circuit thereof by the electronic device, after receiving the deviation value in Step 4;
Step 6, resetting and restarting the electronic device by the master device though the output circuit thereof;
Step 7, adjusting the signal parameters of the action signal outputted by the output circuit according to the deviation value read from the storage circuit of electronic device, and back to executing Step 1 to Step 3, after resetting the electronic device;
Step 8, confirming the signal parameters of the action signal outputted by the electronic device satisfying the preset requirement;
Step 9, conducting writing-in setting to electronic device by the master device, after confirming the signal parameters of the action signal outputted by output circuit satisfying the preset requirement;
Step 10, separating the electronic device from the master device to enable the electronic device to work independently after power-on;
further comprising:
using a frequency/reference voltage regulating unit to matching the clock vibrating frequency of the electronic device to the clock vibrating frequency of the master device.

* * * * *